United States Patent
Takahara et al.

(10) Patent No.: US 9,266,629 B2
(45) Date of Patent: Feb. 23, 2016

(54) ARTICLE STORAGE FACILITY AND ARTICLE STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 529 days.

(21) Appl. No.: 13/733,441

(22) Filed: Jan. 3, 2013

(65) Prior Publication Data

US 2014/0014229 A1    Jan. 16, 2014

(30) Foreign Application Priority Data

Jan. 6, 2012  (JP) .................................. 2012-001557

(51) Int. Cl.
*H01L 21/67* (2006.01)
*B65B 5/00* (2006.01)
*H01L 21/677* (2006.01)
*H01L 21/673* (2006.01)

(52) U.S. Cl.
CPC ............ *B65B 5/00* (2013.01); *H01L 21/67393* (2013.01); *H01L 21/67769* (2013.01)

(58) Field of Classification Search
CPC .................. H01L 21/67393; H01L 21/67763; H01L 21/67769; H01L 21/673
USPC ............. 55/385.2; 206/710–712; 414/222.01, 414/937–940; 141/63, 65, 66, 349
See application file for complete search history.

(56) References Cited

U.S. PATENT DOCUMENTS

| 5,407,181 | A  | * | 4/1995  | Ohsawa .......................... 266/257 |
| 5,696,689 | A  | * | 12/1997 | Okumura et al. ............. 700/121 |
| 5,988,233 | A  | * | 11/1999 | Fosnight et al. ................ 141/63 |
| 6,275,744 | B1 | * | 8/2001  | Yoshida ......................... 700/218 |
| 6,463,348 | B1 | * | 10/2002 | Takechi et al. ................ 700/115 |
| 7,993,458 | B2 | * | 8/2011  | Kondo et al. .................. 118/719 |
| 8,079,797 | B2 | * | 12/2011 | Tanaka et al. ............. 414/222.13 |
| 2002/0197145 | A1 | * | 12/2002 | Yamamoto et al. ........... 414/806 |
| 2007/0251116 | A1 | * | 11/2007 | Huang et al. .................... 34/202 |
| 2008/0014058 | A1 | * | 1/2008  | Hongkham et al. ..... 414/222.01 |
| 2008/0100814 | A1 | * | 5/2008  | Chen et al. ..................... 355/55 |
| 2010/0000625 | A1 | * | 1/2010  | Goto et al. ....................... 141/4 |
| 2012/0074101 | A1 | * | 3/2012  | Nakamura ...................... 216/83 |

FOREIGN PATENT DOCUMENTS

| JP | 201016199 A | 1/2010 |
| JP | 2010182747 A | 8/2010 |

* cited by examiner

*Primary Examiner* — Jason K Niesz
*Assistant Examiner* — Andrew StClair
(74) *Attorney, Agent, or Firm* — The Webb Law Firm

(57) ABSTRACT

When a controller determines that the maximum simultaneous feed number is exceeded by a total target number which is the total number of inactive gas feeding section determined to be controlled to the first feed state at one time, of the inactive gas feeding sections determined to be controlled to the first feed state at one time, the controller controls some of them not more than the maximum simultaneous feed number to the first feed state and executes a start delaying process for the others in which process starting of the first control state is delayed by a set delay period.

14 Claims, 9 Drawing Sheets

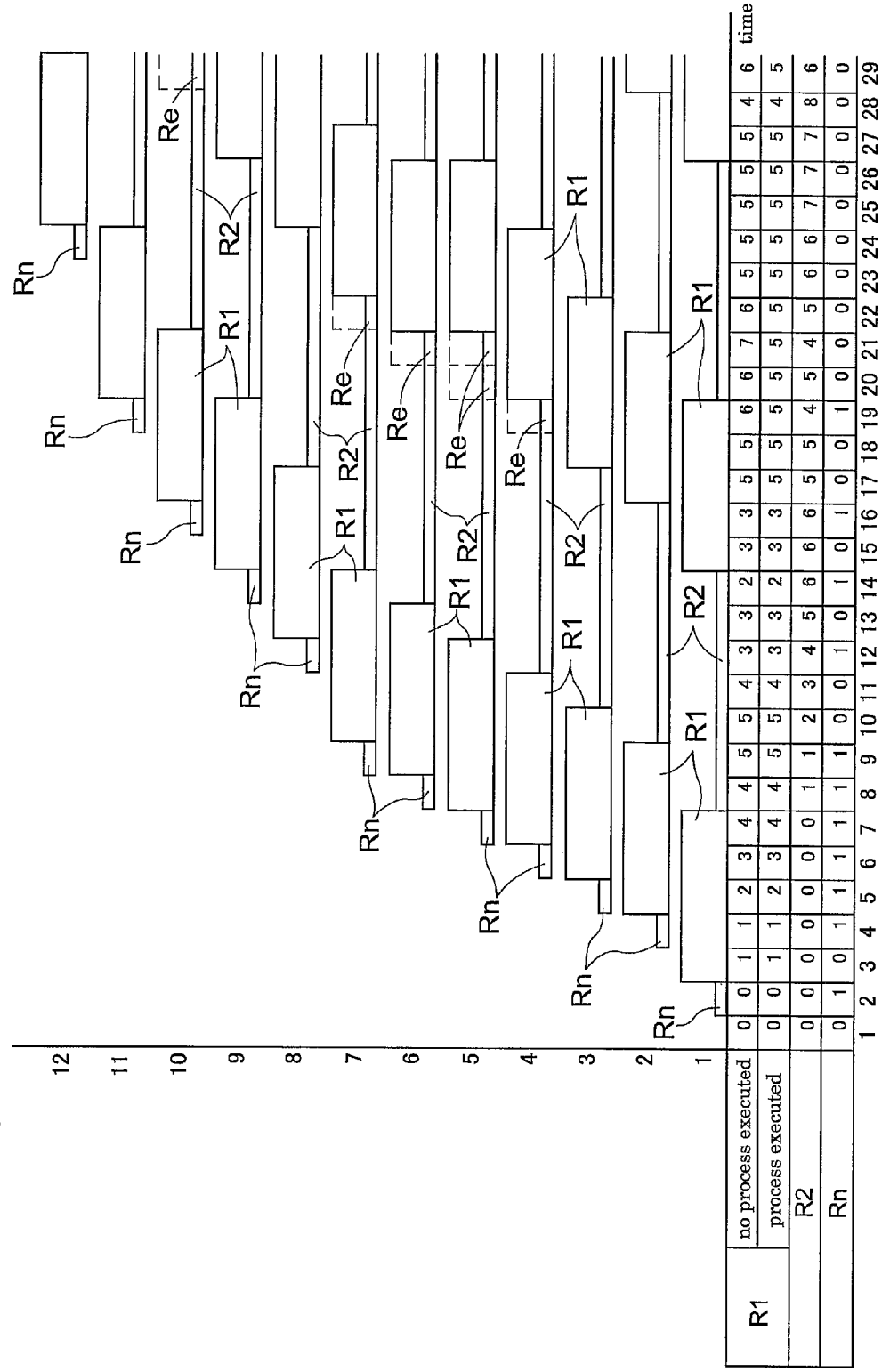

ARTICLE STORAGE FACILITY AND ARTICLE STORAGE METHOD

FIELD OF THE INVENTION

The present invention relates to an article storage facility including a plurality of storage sections each storing therein a transport container accommodating a substrate therein, a transport device for transporting the transport containers to the plurality of storage sections, an inactive gas feeding section for feeding an inactive gas to the inside of the transport container accommodated in the storage section, and a controller for controlling the operation of the transport device and the operation of a flow rate adjusting device of the inactive gas feeding section. The invention relates also to an article storage method utilizing such article storage facility.

BACKGROUND

As an example of such article storage facility described above, there is known an article storage facility having an article storage shelf with a purging function described below. This article storage shelf includes a plurality of storage sections for storing a transport container such as an FOUP, etc. accommodating a semiconductor wafer. Each storage section is provided with a feed nozzle as the inactive gas feeding section for feeding inactive gas such as nitrogen gas, argon gas, etc. to the inside of the transport container, in order to prevent contamination of the semiconductor wafer accommodated in the transport container.

Japanese Unexamined Patent Application Publication No. 2010-16199 (Patent Document 1) discloses an example of such article storage facility. With this article storage facility, the flow rate of inactive gas to be discharged from the feed nozzle is varied between a case when a transport container is stored in the storage section and a case when no transport container is stored in the storage section, such that the flow rate of the inactive gas in the case of no transport container being stored in the storage section is rendered smaller than the flow rate in the case of a transport container being stored in the storage section.

The article storage shelf in Patent Document 1 above includes a plurality of storage sections for storing the transport containers and each storage section includes a detecting device for detecting presence/absence of a transport container in this storage section. If the detecting device detects that a transport container is stored in the storage section, the inactive gas is fed to the inside of the transport container by a flow rate (this flow rate will be referred to as the "first flow rate") sufficient for preventing contamination of the semiconductor wafer accommodated inside this transport container. Conversely, if the detection device detects that no transport container is stored in the storage section, the inactive gas will be discharged from a feed nozzle by a flow rate (this flow rate will be referred to as the "second flow rate") set smaller than the first flow rate, in order to prevent accumulation of impurity particles in the feed nozzle.

And, the above-described switchover of the flow rate is effected by the flow rate adjusting device. The flow rate adjusting device is configured to set the feed rate of inactive gas to a target flow rate commanded by the controller.

In Patent Document 1, in case a plurality of transport containers were stored at one time in the article storage shelf, the controller will command a target flow rate to each flow rate adjusting device so that the inactive gas may be fed by the first flow rate uniformly to all these stored transport containers. However, if the flow rate required for feeding the inactive gas by the first flow rate to all of the transport containers stored at one time in the article storage shelf exceeds the flow rate of the inactive gas that can be fed from the feed source (e.g. a cylinder of nitrogen gas), the flow rate of inactive gas that can be fed to each transport container will fall short of the first flow rate as the target flow rate. Therefore, even when commanded the first flow rate as the target flow rate, the flow rate adjusting device will be unable to adjust the feed flow rate of inactive gas to this target flow rate, whereby there will occur inconvenience that the inactive gas feeding section can feed the inactive gas only by a flow rate below the target flow rate.

The flow rate adjusting device is sometimes provided with a function of outputting an error if there has developed a situation wherein the condition of the actually fed flow rate falling short of the target flow rate has continued for a set period. In the case of using a flow rate adjusting device having such function as above, as described above, if the condition of the flow rate of inactive gas that can be actually fed to each transport container falling short of the first flow rate as the target flow rate has continued for a set period, an error will issue, so that the normal operation of the facility may become impossible.

SUMMARY OF THE INVENTION

In view of the above-described background, there is a need for an article storage facility that can be operated in a normal manner even when inactive gas is fed to a plurality of transport containers from a feed source of inactive gas.

An article storage facility according to the present invention comprises:

a plurality of storage sections each storing a transport container accommodating a substrate therein;

a transport device for transporting the transport containers to the plurality of storage sections;

an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;

a controller for controlling operations of the transport device and the flow rate adjusting device;

a feed source for feeding the inactive gas to a group of the inactive gas feeding sections corresponding to a group of storage sections of the plurality of storage sections;

wherein there is set a maximum allowable flow rate that can be fed from the feed source to the group of inactive gas feeding sections;

the controller is capable of switching over a controlled state of each of the group of inactive gas feeding sections between a first feed state in which the flow rate adjusting device is operated to feed the inactive gas at a first target flow rate to the transport container stored in the storage section and a second feed state in which the flow rate adjusting device is operated to feed the inactive gas at a second target flow rate to the transport container stored in the storage section, the second target flow rate being smaller than the first target flow rate;

the maximum number of the inactive gas feeding sections that can be controlled to the first feed state at one time is set as a maximum simultaneous feed number, the maximum simultaneous feed number being determined based on the maximum allowable flow rate, the first target flow rate and the second target flow rate; and when the controller determines that the maximum simultaneous feed number is exceeded by a total target number which is the total number of the inactive gas feeding section determined to be controlled to the first feed state at one time, of the inactive gas feeding sections determined to be controlled to the first feed state at one time, the controller controls some of them not more than the maximum simultaneous feed number to the first feed state and executes a start delaying process for the others in which process starting of the first feed state is delayed by a set delay period for the others.

With the above-described arrangement, with execution of the start delaying process, it is possible to avoid a situation wherein the command for controlling to the first feed state is issued at one time to a number of inactive gas feeding sections which number exceeds the maximum simultaneous feed number. As a result, it becomes possible to avoid the situation of the flow rate of inactive gas for the inactive gas feeding section falling short of the first flow rate as the target flow rate, whereby the facility can be operated normally.

More particularly, when the transport device stores a transport container in the storage section, the controller controls the operation of the flow rate adjusting device so as to start feeding of inactive gas to the transport container stored in this storage section. This adds another inactive gas feeding section controlled under the first feed state to those inactive gas feeding sections controlled in advance to the first feed state. Hence, if the sum of the target flow rates of the inactive gas feeding sections controlled in advance to either the first feed state or the second feed state and the target flow rate of the inactive gas feeding section newly controlled to the first feed state exceeds the maximum allowable flow rate, the feed rates of the inactive gas therefor will fall short of the target flow rates. Further, in case feeding of inactive gas is resumed after temporary stopping of feeding for all of the inactive gas feeding sections, or in case as a result of e.g. switchover from a manual operation to an automatic operation, the timings of starting the first feed state coincide with each other for the inactive gas feeding sections corresponding to all the storage sections storing the transport containers, all of the inactive gas feeding sections will be controlled to the first feed state in order to realize speedy replacement of the gas present inside the transport container by new inactive gas. In such case, if the total of the target flow rates exceeds the maximum allowable flow rate, the feed rate of inactive gas for each inactive gas feeding section will fall short of the target flow rate.

On the other hand, with the above-described inventive arrangement, of the inactive gas feeding sections determined to be controlled to the first feed state at one time, some of them not more than the maximum simultaneous feed number are controlled to the first feed state and the feeding of inactive gas is continued, whereas, for the rest thereof, starting of the first feed state is delayed by a set delay period. Therefore, even in case the inactive gas is fed from the inactive gas feed source to the plurality of transport containers too, it is possible to avoid the situation of the feed rate of inactive gas falling short of the target feed rate, so that the facility can be operated normally.

The technical features of the article storage facility according to the present invention may be applied to an article storage method. Hence, the present invention can claim protection for such method as well. And, with this inventive article storage method too, the above-described advantageous function/effect of the article storage facility can be achieved.

That is, an article storage method according to the present invention utilizing an article storage facility comprising:

a plurality of storage sections each storing a transport container accommodating a substrate therein;

a transport device for transporting the transport containers to the plurality of storage sections;

an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;

a controller for controlling operations of the transport device and the flow rate adjusting device;

a feed source for feeding the inactive gas to a group of the inactive gas feeding sections corresponding to a group of storage sections of the plurality of storage sections;

wherein there is set a maximum allowable flow rate that can be fed from the feed source to the group of inactive gas feeding sections;

the controller is capable of switching over a controlled state of each of the group of inactive gas feeding sections between a first feed state in which the flow rate adjusting device is operated to feed the inactive gas at a first target flow rate to the transport container stored in the storage section and a second feed state in which the flow rate adjusting device is operated to feed the inactive gas at a second target flow rate to the transport container stored in the storage section, the second target flow rate being smaller than the first target flow rate;

the maximum number of the inactive gas feeding sections that can be controlled to the first feed state at one time is set as a maximum simultaneous feed number, the maximum simultaneous feed number being determined based on the maximum allowable flow rate, the first target flow rate and the second target flow rate;

the article storage method comprises the following step to be executed by the controller:

a feed state controlling step at which when it is determined that the maximum simultaneous feed number is exceeded by a total target number which is the total number of the inactive gas feeding section determined to be controlled to the first feed state at one time, of the inactive gas feeding sections determined to be controlled to the first feed state at one time, some of them not more than the maximum simultaneous feed number are controlled to the first feed state and a start delaying process is executed for the others in which process starting of the first feed state is delayed by a set delay period.

Next, preferred embodiments of the present invention will be explained.

According to a preferred embodiment of the article storage facility relating to the present invention, the controller is configured to control a delaying process target feeding section as the inactive gas feeding section subjected to the start delaying process to the second feed state.

With the above-described arrangement, for the delaying process target feeding section, while the start of the first feed state is being delayed, feeding of inactive gas is made continuously possible at the second flow rate, though this rate is smaller than the first target flow rate, so that the inside of the transport container can be maintained under the maximally favorable condition.

According to a further preferred embodiment of the article storage facility relating to the present invention, when the controller determines that the maximum simultaneous feed number is exceeded by the total target number, of the inactive gas feeding sections determined to be controlled to the first feed state at one time, the controller controls the same number of the inactive gas feeding sections as the maximum simultaneous feed number to the first feed state and executes the start delaying process for the others.

With the above-described arrangement, it is possible to control to the first feed state, the maximum number of inactive gas feeding sections that can avoid the situation of the flow rate of the inactive gas for the inactive gas feeding section falling short of the first flow rate as the target flow rate. Hence, for the facility as a whole, the inside of the transport container can be maintained under the maximally favorable condition.

According to a further preferred embodiment of the article storage facility relating to the present invention:

there is provided a simultaneous feed calculating section for calculating the maximum simultaneous feed number;

the controller is configured to be capable of switching over the controlled state of each of the group of inactive gas feeding sections not only between the first feed state and the second feed state, but also to a pre-storage feed state in which the flow rate adjusting device is operated to feed the inactive gas to the discharge opening of the storage section at a pre-storage target flow rate smaller than the first target flow rate only for duration of a set period prior to storage of the transport container in the storage section; and the simultaneous feed calculating section calculates the maximum simultaneous feed number, based on the maximum allowable flow rate, the first target flow rate, the second target flow rate and the pre-storage target flow rate.

With the above-described arrangement, when a transport container is to be stored in a storage section, it is possible to clean impurity particles or the like adhering to the discharge opening of this storage section, by the pre-storage target flow rate of inactive gas, prior to arrival of the transport container. Therefore, it is possible to prevent intrusion of impurity particles or the like adhering to the discharge opening to the inside of the transport container stored in the storage section, so that deterioration of the condition inside the transport container can be prevented advantageously.

Further, with the above-described arrangement, the maximum simultaneous feed number is calculated, with consideration not only to the maximum allowable flow rate, the first target flow rate and the second target flow rate, but also to the pre-storage target flow rate. Hence, in the case also when the flow rate adjusting device is operated to provide the pre-storage feed state prior to providing the first feed state, it is possible to avoid the situation of the total of the target flow rates of the inactive gas for all of the group of inactive gas feeding sections exceeding the maximum allowable flow rate.

According to a further preferred embodiment of the article storage facility relating to the present invention:

there is provided a simultaneous feed calculating section for calculating the maximum simultaneous feed number; and the simultaneous feed calculating section is configured to calculate the maximum simultaneous feed number such that the total of the target flow rates of the inactive gas for all of the group of inactive gas feeding sections may be smaller than or equal to the maximum allowable flow rate.

With the above-described arrangement, unless the command for controlling to the first feed state is issued at one time to a number of inactive gas feeding sections exceeding the maximum simultaneous feed number, the total of the target flow rates for all of the group of inactive gas feeding sections will not exceed the maximum allowable flow rate. Therefore, under the condition wherein the command for controlling to the first feed state is not issued at one time to a number of inactive gas feeding sections exceeding the maximum simultaneous feed number, it is possible to avoid the situation in which the flow rate of inactive gas that can be fed to each inactive gas feeding state falls short of the target flow rate. As a result, it is possible to avoid such a situation that the inactive gas cannot be fed to each transport container by the amount required thereby, thus leading to deterioration of the condition inside this transport container.

According to a further preferred embodiment of the article storage facility relating to the present invention, after execution of the start delaying process, if the controller determines that the total target number falls short of the maximum simultaneous feed number, the controller executes a feed process in which of delaying process target feeding sections subjected to the execution of the start delaying process, a number of these delaying process target feeding sections not exceeding a difference between the total target number and the maximum simultaneous feed number are controlled to the first feed state.

With the above-described arrangement, for the delaying process target feeding sections not exceeding in number the difference between the total target number and the maximum simultaneous feed number, the first feed state which has been delayed can now be started. Therefore, it is possible to appropriately prevent deterioration of the conditions inside the transport containers stored in the storage sections that correspond to these delaying process target feeding sections.

According to a further preferred embodiment of the article storage facility relating to the present invention, the controller is configured to effect management based on identification information of the plurality of storage sections, in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and the controller selects the delaying process target feeding sections to be subjected to the execution of the feed process according to the priority order of the storage sections.

With the above-described arrangement, the storage order of storing the transport containers into the storage sections and the execution order of the feed process can be determined according to the single same priority order set based on the identification information. Hence, the control scheme for determining the respective orders above can be simplified.

According to a further preferred embodiment of the article storage facility relating to the present invention:

there is provided a standby period determining section for determining a standby period which is a period measured from the start of the start delaying process for each of the delaying process target feeding sections;

the controller is configured to effect management based on the identification information of the plurality of storage sections;

in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and the controller executes the feed process for the delaying process target feeding sections in the order starting from ones having longer standby periods determined by the standby period determining section.

With the above-described arrangement, for those delaying process target feeding sections having long periods from the start of the start delaying process, further delaying of start of the first feed state can be avoided, so that the deterioration of the condition inside the transport container can be restricted appropriately.

According to a preferred embodiment of the article storage method relating to the present invention, at the feed state controlling step, a delaying process target feeding section as the inactive gas feeding section subjected to the start delaying process is controlled to the second feed state.

According to a preferred embodiment of the article storage method relating to the present invention, at the feed state controlling step, when it is determined that the maximum simultaneous feed number is exceeded by the total target number, of the inactive gas feeding sections determined to be controlled to the first feed state at one time, the same number of the inactive gas feeding sections as the maximum simultaneous feed number are controlled to the first feed state and the start delaying process is executed for the others.

According to a further preferred embodiment of the article storage method relating to the present invention, the controller is configured to be capable of switching over the controlled state of each of the group of inactive gas feeding sections not only between the first feed state and the second feed state, but also to a pre-storage feed state in which the flow rate adjusting device is operated to feed the inactive gas to the discharge opening of the storage section at a pre-storage target flow rate smaller than the first target flow rate only for duration of a set period prior to storage of the transport container in the storage section;

as a further step to be executed by the controller, there is provided a simultaneous feed number calculating step for calculating the maximum simultaneous feed number; and at the simultaneous feed number calculating step, the maximum simultaneous feed number is calculated, based on the maximum allowable flow rate, the first target flow rate, the second target flow rate and the pre-storage target flow rate.

According to a preferred embodiment of the article storage method relating to the present invention:

as a further step to be executed by the controller, there is provided a simultaneous feed number calculating step for calculating the maximum simultaneous feed number; and at the simultaneous feed number calculating step, the maximum simultaneous feed number is calculated such that the total of the target flow rates of the inactive gas for all of the group of inactive gas feeding sections may be smaller than the maximum allowable flow rate.

According to a preferred embodiment of the article storage method relating to the present invention, at the feed state controlling step, after execution of the start delaying process, if it is determined that the total target number falls short of the maximum simultaneous feed number, a feed process is executed in which of the delaying process target feeding sections subjected to the execution of the start delaying process, a number of these delaying process target feeding sections not exceeding a difference between the total target number and the maximum simultaneous feed number are controlled to the first feed state.

According to a further preferred embodiment of the article storage method relating to the present invention:

the controller is configured to effect management based on identification information of the plurality of storage sections, in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and at the feed state controlling step, the delaying process target feeding sections to be subjected to the execution of the feed process are selected according to the priority order of the storage sections.

According to a preferred embodiment of the article storage method relating to the present invention:

the article storage facility includes a standby period determining section for determining a standby period which is a period measured from the start of the start delaying process for each of the delaying process target feeding sections;

the controller is configured to effect management based on the identification information of the plurality of storage sections;

in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and at the feed state controlling step, the feed process is executed for the delaying process target feeding sections in the order starting from ones having longer standby periods determined by the standby period determining section.

BRIEF DESCRIPTION OF THE DRAWINGS

FIG. 10 is a timing chart showing result of execution of a start delaying process.

DETAILED DESCRIPTION

Next, embodiments of the present invention as being applied to an article storage facility with a purging function will be explained with reference to the accompanying drawings.

(General Construction)

Figure 1:
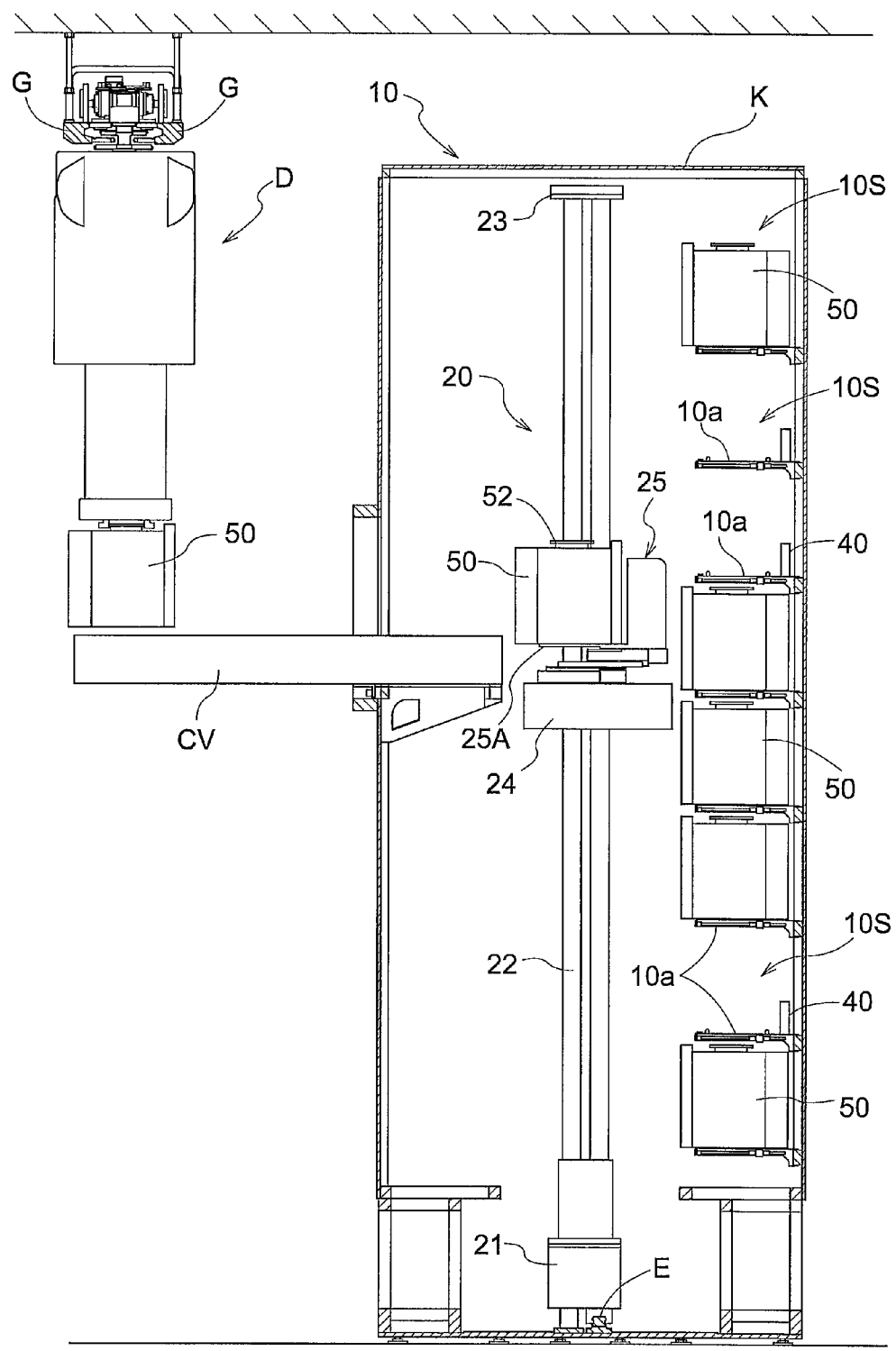
FIG. 1 is a side view in vertical section of an article storage facility.
Figure 2:
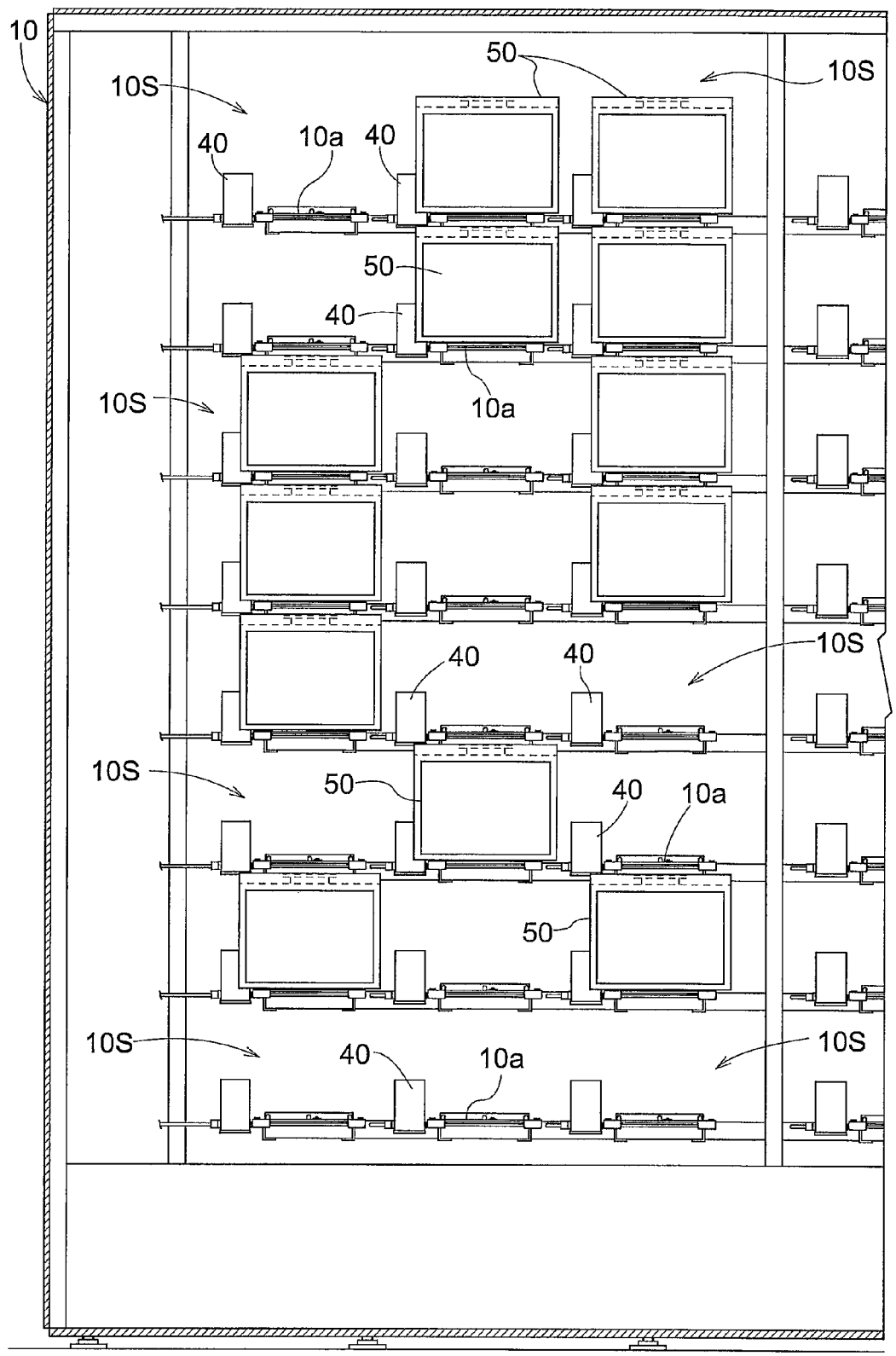
FIG. 2 is a front view in vertical section showing a portion of the facility.

An article storage facility, as shown in FIG. 1 and FIG. 2, includes a storage shelf 10 for storing transport containers 50 (to be referred to shortly as "containers 50" hereinafter) each accommodating a substrate therein under a sealed state, a stacker crane 20 as a transport device, and a carry in/out conveyor CV as a carry in/out section for the containers 50.

The storage shelf 10 and the stacker crane 20 are disposed in an installment space having its outer periphery covered with a wall body K and the carry in/out conveyor CV is disposed to extend through the wall body K.

The storage shelf 10 includes a plurality of storage sections 10S, as support portions for supporting the containers 50, juxtaposed along the vertical direction and the right/left direction, each of the plurality of storage sections 10S being configured to store the container 50. The details of this will be explained later.

And, in the instant embodiment, as shown in FIG. 1, there is mounted a hoist-type transport carriage D which travels along a guide rail G attached to the ceiling portion of a cleanroom in which the article storage facility is installed. By this hoist type transport carriage D, the container 50 can be carried in/out relative to the carry in/out conveyer CV.

(Construction of Container 50)

The container 50 is a gas-sealed container made of synthetic resin in compliance with the SEMI (Semiconductor Equipment and Material Institute) standard and is used for accommodating a semiconductor wafer W (see FIG. 4) as a substrate. This container 50 is referred to as a FOUP (Front Opening Unified Pod). And, though not detailed herein, in the front face of the container 50, there is formed an opening which can be opened/closed with a detachable lid for carrying in/out substrates. In the upper face of the container 50, there is formed a top flange 52 which can be gripped by the hoist type transport carriage D. In the bottom face of the container 50, there are formed three engagement grooves (not shown) engageable by positioning pins 10b (see FIG. 3).

Figure 4:
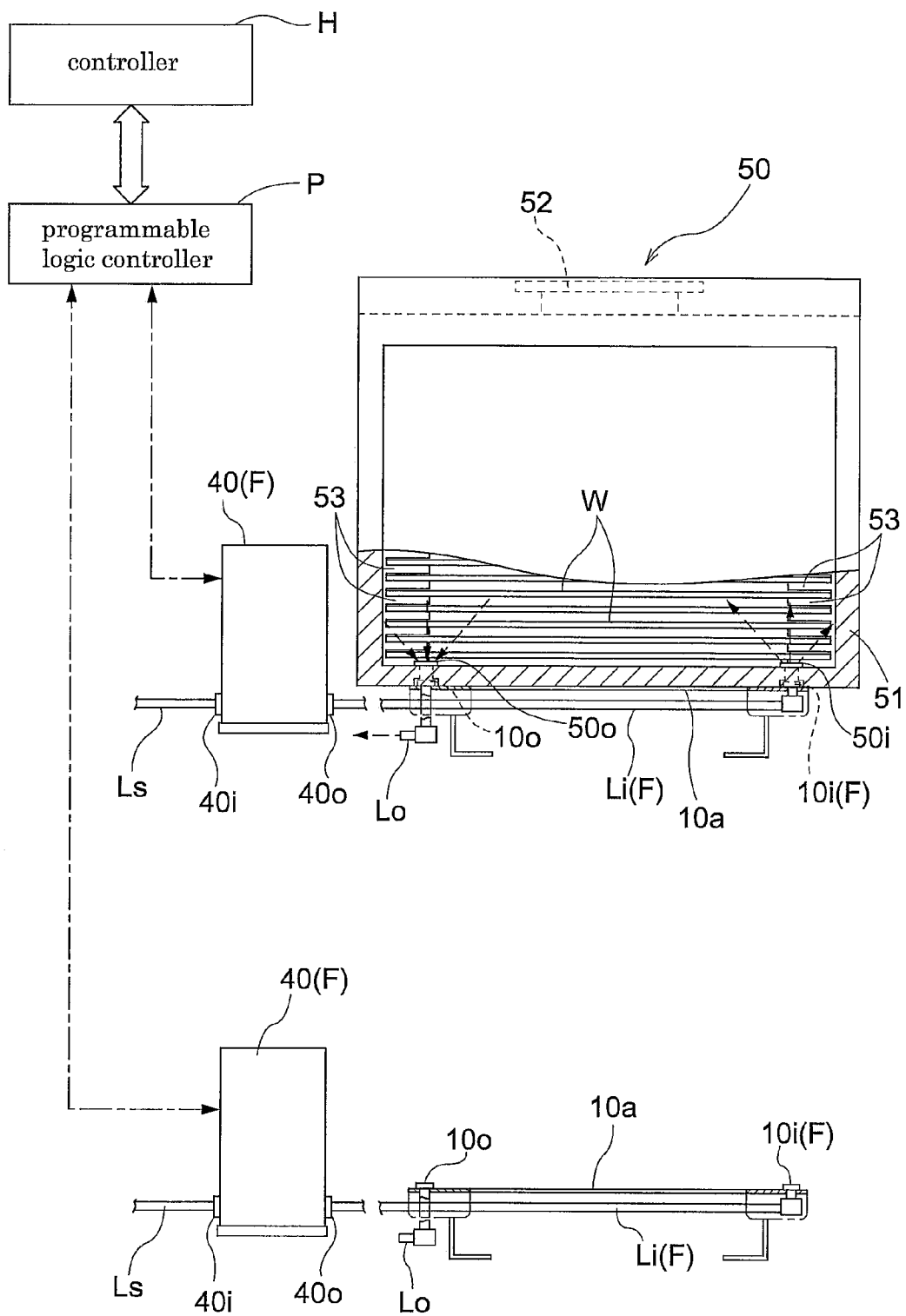
FIG. 4 is a schematic construction diagram showing the relationship between a storage section and a transport container.

More particularly, the container 50, as shown in FIG. 4, includes a casing 51 having substrate supports 53 capable of loading a plurality of semiconductor wafers W at different vertical positions therein and an unillustrated lid. The container 50 is configured such that the inner space thereof is sealed gas-tightly when the lid is attached to the casing 51. And, when the container 50 is stored in the storage section 10S, the container 50 is fixed in position by the positioning pins 10b.

Further, as shown in FIG. 4, in the bottom of the container 50, there are provided a gas feed opening 50i for introducing an amount of nitrogen gas as an inactive gas and a gas discharge opening 50o. Though not shown, at the gas feed opening 50i, there is provided an introducing side opening/closing valve: and at the gas discharge opening 50o, there is provided a discharging side opening/closing valve.

The introducing side opening/closing valve is urged in its closing direction by means of an urging member such as a spring. In operation, when the discharge pressure of nitrogen gas fed to the gas feed opening 50i becomes higher than a set valve opening pressure higher than the atmospheric pressure by a set value, the introducing side opening/closing valve is opened by this pressure.

Further, the discharging side opening/closing valve is urged by an urging member such as a spring in the closing direction, so that when the pressure inside the container 50 reaches a pressure higher than a set valve opening pressure higher than the atmospheric pressure by a set value, the valve is opened by this pressure.

(Construction of Stacker Crane 20)

The stacker crane 20 includes a traveling carriage 21 which can run along a traveling rail E installed on the floor on the side of the front face of the storage shelf 10, a mast 22 mounted erect on the traveling carriage 21, and a lift deck 24 which can move up/down as being guided by the mast 22.

Incidentally, though not shown, an upper frame 23 provided at the upper end of the mast 22 is movable as being engaged with an upper guide rail attached to the ceiling of the installment space having its outer periphery covered by the wall body K.

On the lift deck 24, there is mounted a transfer device 25 for transferring the container 50 to/from the storage section 10S.

The transfer device 25 includes a plate-like loading support body 25A which loads and supports the container 50 thereon, with the loading support body 25A being projectable and retractable between a projecting position projecting into the storage section 10S and a retracted position retracted toward the lift deck 24 side. The stacker crane 20 including the transfer device 25 is configured to effect an unloading operation for unloading the container 50 loaded on the loading support body 25A onto the storage section 10S, and a retrieving operation for retrieving the container stored in the storage section 10S, in association with projecting/retracting operations of the loading support body 25A and lifting up/down operations of the lift deck 24.

That is, the container 50 loaded onto the carry in/out conveyer CV by the transport carriage D is conveyed by this carry in/out conveyer CV from the outside to the inside of the wall member K and then conveyed to one of the plurality of storage sections 10S by the stacker crane 20.

Namely, the stacker crane 20 as a transport device is configured to transport the container 50 to the plurality of storage sections 10S.

The stacker crane 20, though not shown, includes a traveling position detector for detecting the traveling position on the traveling passage and a lifting position detector for detecting the lifting position of the lift deck 24. So that, based on detection information of the traveling position detector and the lifting position detector, a crane controller 113 as a controller H for controlling operations of the stacker crane 20 controls the operations of the stacker crane 20.

More particularly, in order to effect a carry-in operation for carrying a container 50 carried into the carry in/out conveyer CV into the storage section 10S and a carry-out operation for carrying the container 50 stored in the storage section 10S out onto the carry in/out conveyer CV, the crane controller H3 controls the traveling operation of the traveling carriage 21, the lifting operation of the lift deck 24 and the projecting/retracting operations of the loading support body 25A of the transfer device 25.

(Construction of Storage Section 10S)

Figure 3:
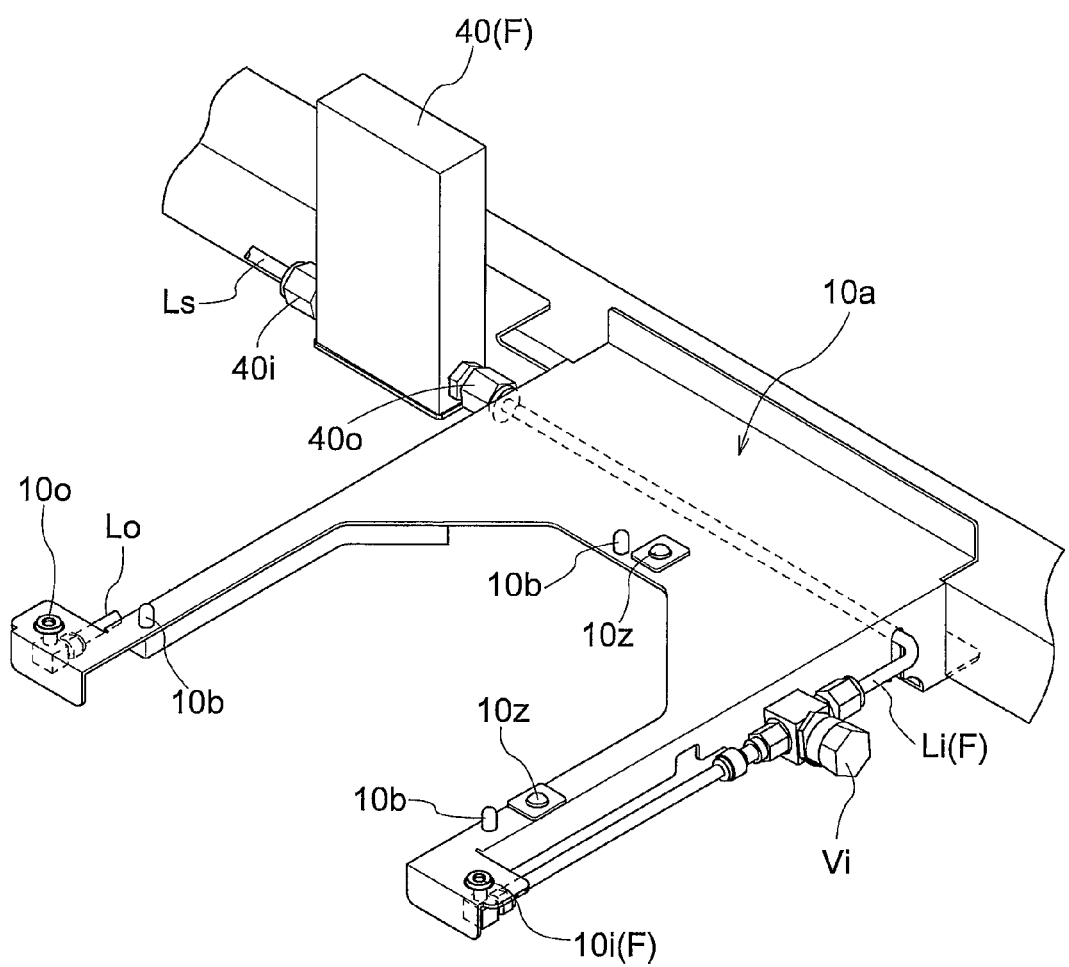
FIG. 3 is a perspective view of a storage section.

As shown in FIG. 3 and FIG. 4, each one of the plurality of storage sections 10S includes a plate-like loading support portion 10a for loading and supporting the container 50 thereon.

This loading support portion 10a has a U-shape as viewed in the plane view thereof so as to form a space for allowing vertical passage of the loading support body 25A of the transfer device 25, and in the upper face, the afore-mentioned positioning pins 10b project upwards therefrom.

Further, the loading support portion 10a includes a pair of load presence sensors 10z for detecting whether the container 50 is loaded or not (that is, whether a container 50 is loaded in the storage section 10S or not). And, detection information thereof are inputted to a purge controller H1 as a controller H (see FIG. 6) for managing the operation of a mass flow controller 40 as a flow rate adjusting device which will be described later.

The loading support portion 10a further includes a discharge nozzle 10i as a discharge opening for feeding nitrogen gas as an inactive gas into the inside of the container 50 and a discharging gas passage body 10o to be passed by a gas discharged from the inside of the container 50. And, to the discharge nozzle 10i, there is connected a feed pipe Li for flowing nitrogen gas from the mass flow controller 40, and to the discharging gas passage body 10o, there is connected a discharge pipe Lo open at its end.

Further, as shown in FIG. 1 and FIG. 2, at a position deep into each storage section 10S as viewed in the plan view and corresponding to the vicinity of the end of the container 50 along the right/left direction of the shelf, there is mounted the mass flow controller 40 for controlling the feeding of nitrogen gas. The deep side of each storage section 10s in the plan view is the side of the end opposite to the opening (inlet/outlet) for carrying in/out the container 50.

The storage sections 10S are disposed on the storage shelf 10 as being distributed to a plurality of layers juxtaposed along the vertical direction. And, the mass flow controller 40 is disposed at a position overlapped in the plan view with a mass flow controller 40 disposed in a storage section 10s of a different layer. The disposing position of the mass flow controller 40 is a position where no loading support portion 10a or a post or the like supporting it is present as viewed in the plan view and also where the container 50 is not present when this container 50 is stored. Therefore, in the vicinity of the mass flow controller 40, there is formed a space which communicates from the lower end to the upper end of the storage shelf 10 and allows passage of air therein along the vertical direction.

With the above, the air flow resulting from the heat generated by the mass flow controller 40 is allowed to flow from the lower end to the upper end of the storage shelf 10 without being hindered by any obstacle. As a result, it is possible to prevent an amount of heat radiated from the mass flow controller 40 from stagnatingly staying there, thus restricting occurrence of a failure such as an erroneous operation of the mass flow controller 40 caused by heat.

Incidentally, the above-described space that allows passage of air allows its downflow with reduced resistance when e.g. the storage shelf 10 is maintained under a clean condition by the downflow of the inactive gas or clean air. In this case too, the mass flow controller 40 will be appropriately cooled by the downflow.

When the container 50 is loaded and supported on the loading support portion 10a, the discharge nozzle 10i is connected under an engaged state to the gas feed opening 50i of the container 50 and the discharging gas passage body 10o is connected under an engaged state to the gas discharge opening 50o of the container 50.

Then, under the condition of the container 50 being loaded and supported on the loading support portion 10a, nitrogen gas is discharged from the discharge nozzle 10i at a pressure higher than the atmospheric pressure by a set value, whereby the gas present inside the container 50 is discharged through the gas discharge opening 50o to the outside and the nitrogen gas can be introduced to the inside of the container 50 through the gas feed opening 50i of the container 50.

In the instant embodiment, mainly, the mass flow controller 40, the feed pipe Li, and the discharge nozzle 10i together constitute an inactive gas feeding section F.

Namely, the inactive gas feeding section F includes the discharge nozzle 10i for discharging the inactive gas and the mass flow controller 40 capable of adjusting the flow rate of the inactive gas to be discharged from this discharge nozzle 10i and this section is configured to feed the inactive gas to the inside of the container 50 stored in the storage section 10S. And, this inactive gas feeding section F is provided for each one of the plurality of storage sections 10S.

Incidentally, as shown in FIG. 3, the feed pipe Li incorporates a manual operation type opening/closing valve Vi, such that a change of condition to stop the feeding of the nitrogen gas may be realized at the time of e.g. an emergency due to malfunctioning of the mass flow controller 40.

(Construction for Feeding Nitrogen Gas)

Figure 5:
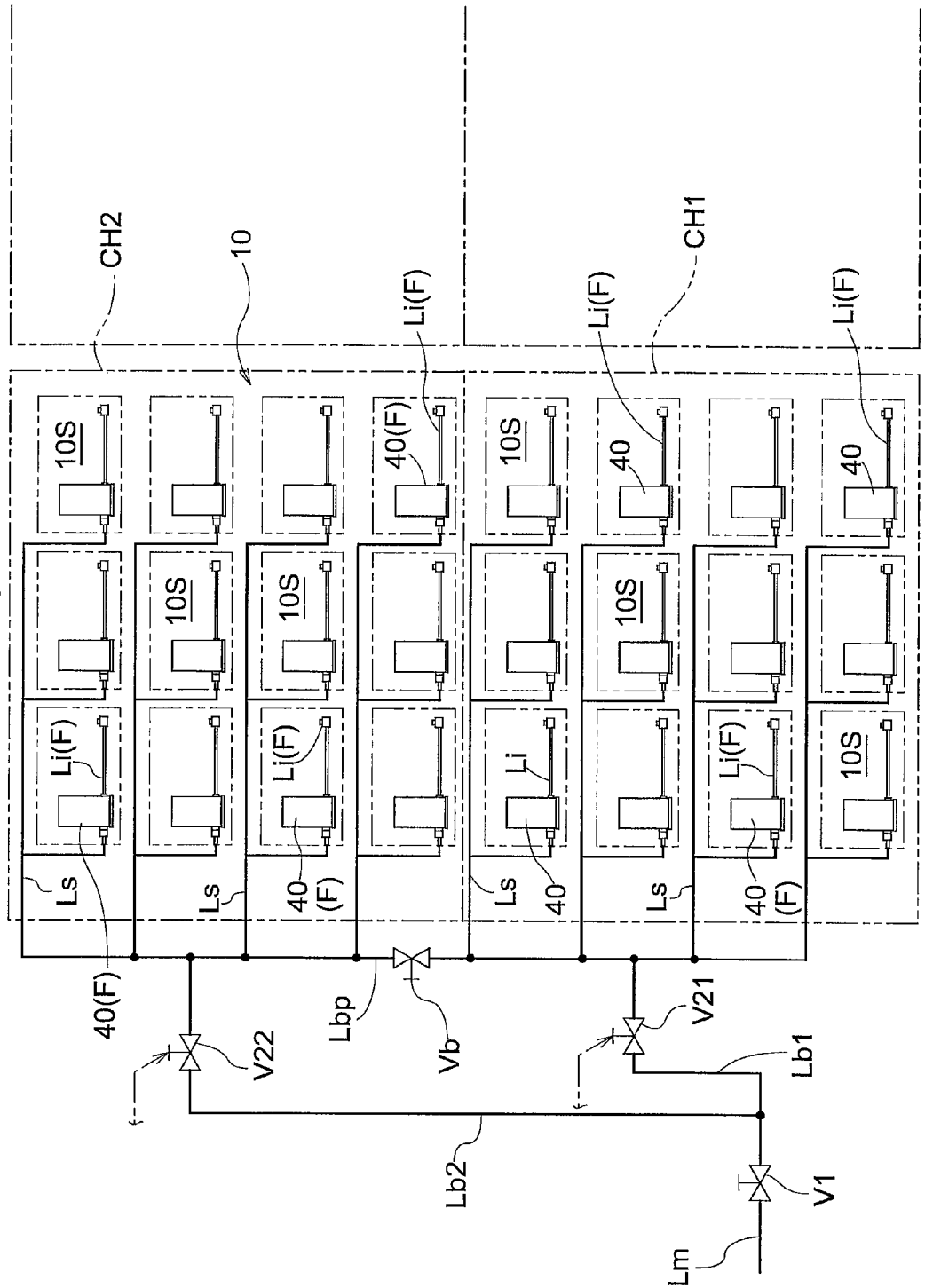
FIG. 5 is a diagram illustrating a manner of feeding inactive gas to a plurality of storage sections.

As shown in FIG. 5, there is provided a source gas feed pipe Lm as a nitrogen gas feed source for feeding nitrogen gas to each of the inactive gas feeding sections F on the storage shelves 10. And, this source gas feed pipe Lm is branched into two parts, i.e. a first branch feed pipe Lb1 and a second branch feed pipe Lb2. Further, the source gas feed pipe Lm incorporates a source gas opening/closing valve V1 for enabling switching between feeding and stop of feeding of nitrogen gas for each one of the storage shelves 10.

Each of the first branch fee pipe Lb1 and the second branch feed pipe Lb2 is further branched into twelve feed pipes Ls. And, each feed pipe Ls is connected to an introducing side port 40i of the mass flow controller 40. In the following discussion, the group of inactive gas feeding sections F fed with the nitrogen gas from the first branch feed pipe Lb1 will be referred to as a first channel (CH1) and the group of inactive gas feeding sections F fed with the nitrogen gas from the second branch feed pipe Lb2 will be referred to as a second channel (CH2).

The first branch feed pipe Lb1 incorporates a first electromagnetic opening/closing valve V21 and the second branch feed pipe Lb2 incorporates a second electromagnetic opening/closing valve V22. And, these valves, i.e. the first electromagnetic opening/closing valve V21 and the second electromagnetic opening/closing valve V22 are electrically connected to the purge controller H1 via an IO extension module A to be described later, so that the purge controller H1 controls opening/closing of the first electromagnetic opening/closing valve V21 and the second electromagnetic opening/closing valve V22.

Further, the first branch feed pipe Lb1 and the second branch feed pipe Lb2 are connected to each other via a bypass pipe Lbp on the downstream sides of the first electromagnetic opening/closing valve V21 and the second electromagnetic opening/closing valve V22. And, the bypass pipe Lpb incorporates a bypass valve Vb which can be opened/closed manually. Hence, when the bypass valve Vb is opened, the first channel CH1 and the second channel CH2 are connected to each other so that nitrogen gas can be fed respectively thereto.

In the instant embodiment, each of the channels CH1, CH2 corresponds to what is referred to as "a group of inactive gas feeding sections F" corresponding to a group of storage sections of the plurality of storage sections. And, each of the first branch feeding pipe Lb1 and the second branch feeding pipe Lb2 corresponds to "a feed source" for feeding nitrogen gas to the group of inactive gas feeding sections F.

(Construction of Mass Flow Controller 40)

As shown in FIG. 3 and FIG. 4, the mass flow controller 40 includes the introducing side port 40i and a discharging side port 40o. To the discharging side port 40o, the feed pipe Li is connected. And, to the introducing side port 40i, there is connected an introducing side pipe Ls for guiding nitrogen gas from the first branch feed pipe Lb1 or the second branch feed pipe Lb2 as the nitrogen gas feed source.

Incidentally, the nitrogen gas feed source includes a governor for adjusting the feed pressure of the nitrogen gas to a set pressure higher than the atmospheric pressure by a set value, and a manual operation type opening/closing valve for allowing/inhibiting feeding of the nitrogen gas, etc.

The mass flow controller 40 includes a flow rate adjusting valve for variably adjusting the flow rate of the nitrogen gas which flows in the inner passage from the introducing side port 40i to the discharging side port 40o, a flow rate sensor for determining the flow rate of the nitrogen gas which flows in the inner passage, and an internal control unit for controlling the operations of the flow rate adjusting valve.

And, the internal control unit is configured to control the flow rate adjusting valve based on the detection information from the flow rate sensor so as to adjust the feed rate to the container 50 to a target flow rate commanded from the aforementioned purge controller H1. That is, the purge controller H1 is configured to control the operations of the mass flow controller 40.

(Construction of Controller H)

Figure 6:
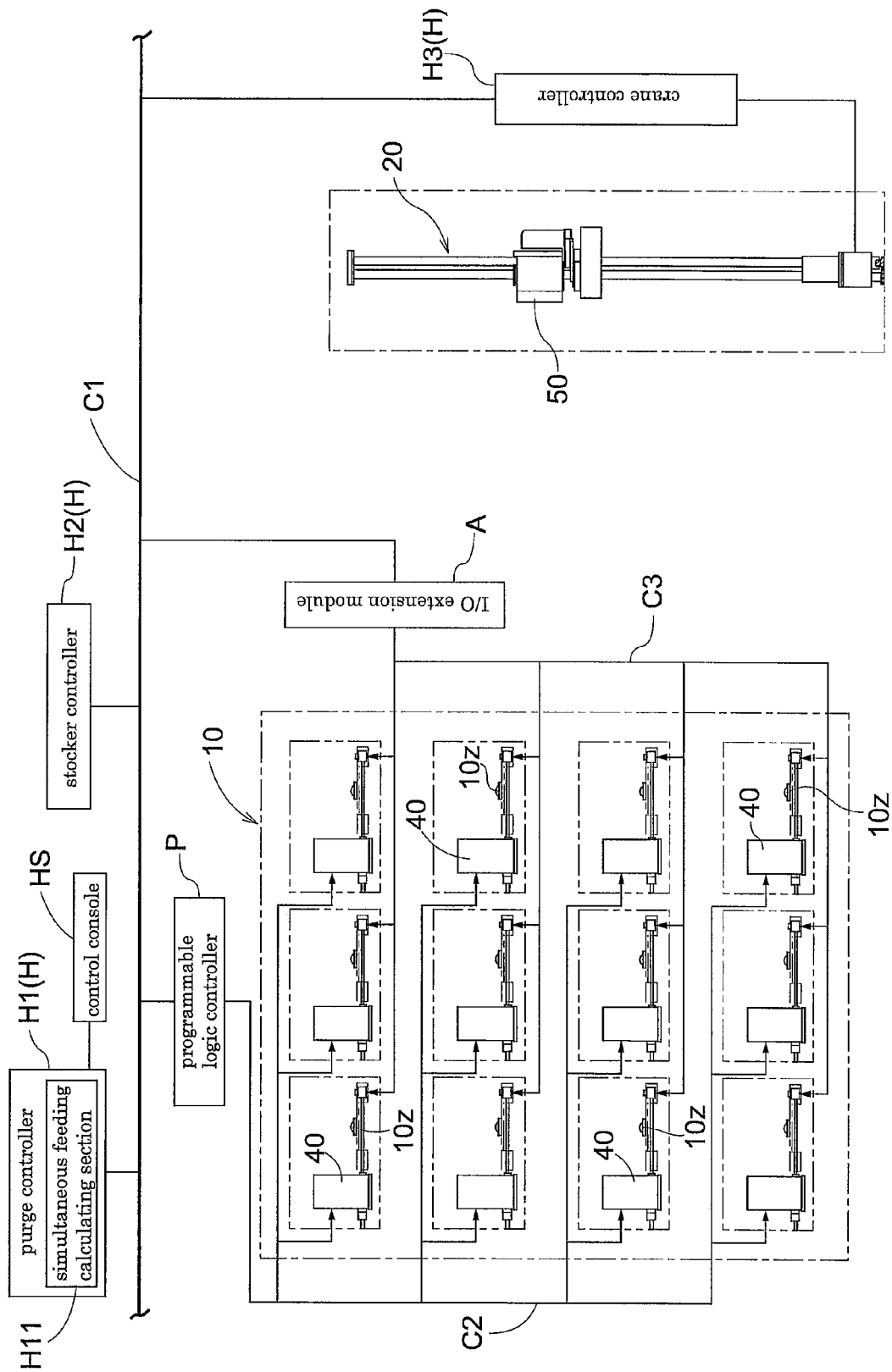
FIG. 6 is a connection construction diagram of a controller.

As shown in FIG. 6, the controller H includes the purge controller H1 for controlling the mass flow controller 40, a stocker controller H2 for managing e.g. the storage condition of the container 50 on the storage shelf 10, and a crane controller H3 for controlling the operation of the stacker crane 20. The purge controller H1, the stocker controller H2 and the crane controller H3 can comprise e.g. computers for processing information by the stored program method and are connected to each other via a network C1 such as a LAN. Further, a programmable logic controller P and an IO extension module A are connected to the network C1 to be capable of communicating with the controller H.

To the programmable logic controller P, there are connected, via a control bus C2, twelve mass flow controllers 40. Also, to the IO extension module A, there are connected, via respective signal lines C3, load presence sensors 10z corresponding to the storage sections 10S having the twelve mass flow controllers 40.

The purge controller H1 commands, via the programmable logic controller P, a target flow rate to the mass flow controller 40 provided in correspondence with each of the plurality of storage sections 10S.

Incidentally, the controller H is provided with a control console HS for allowing inputs of various kinds of information.

The stocker controller H2 is configured to manage the plurality of storage sections 10S based on identification information such as ID numbers. When an upper-level controller (e.g. a scheduler for managing work schedule) transmits thereto storage requests for the containers 50, the stocker controller H2 selects, from the plurality of storage sections 10S, empty storage sections 10 for storing these containers 50, according to the priority order set based on the identification information. Then, the stocker controller H2 issues a storage command to the crane controller H3 for storing the containers 50 in the selected empty storage sections 10S.

Then, the crane controller H3 controls the operation of the stacker crane 20 so as to store the containers 50 in the storage sections 10s commanded by the storage command from the stocker controller H2.

In the instant embodiment, the priority order is set according to order of the serial ID numbers as the identification information.

The target flow rate commanded by the purge controller H1 includes, as some non-limiting examples thereof, a target flow rate for storage to be commanded to the mass flow controller 40 in order to introduce nitrogen gas into the container 50 when this container 50 is accommodated in the storage section 10S, a target flow rate for nozzle cleaning to be commanded in order to clean the discharge nozzle 10i immediately before the container 50 is stored in the storage section 10S and a target flow rate for cleaning to be commanded in order to clean the discharge nozzle 10i, the feed pipe Li, etc at the time of e.g. installment of the storage shelf 10.

Figure 7:
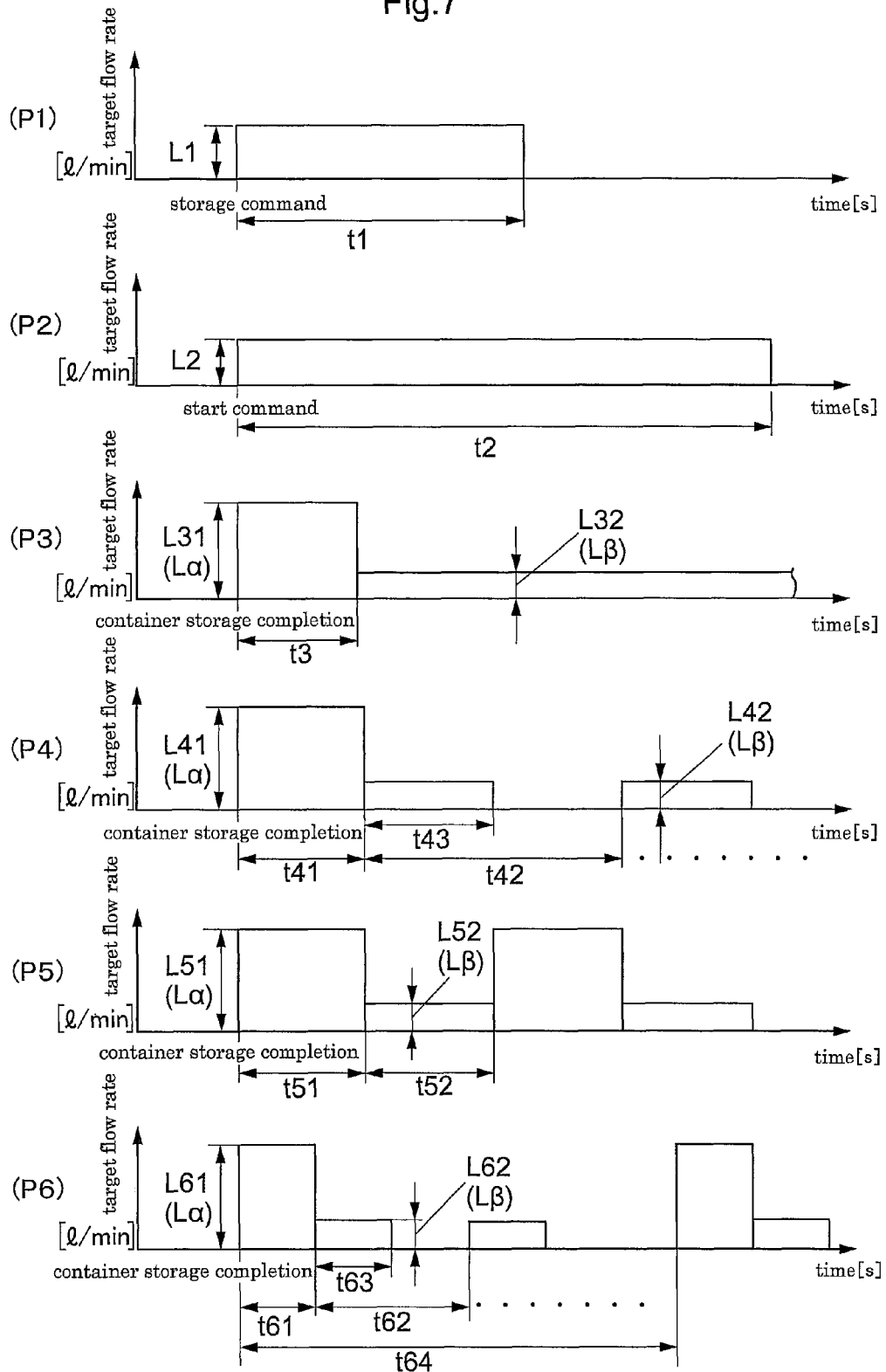
FIG. 7 is an explanatory view showing a manner of controlling the flow rate of inactive gas.

Namely, the purge controller H1, as shown in FIG. 7, stores or memorizes therein, as a plurality of purge patterns each defining a target flow rate and a feed period, a nozzle purge pattern P1, a cleaning pattern P2 and four storage purge patterns P3-P6.

And, at the time of e.g. installment of the storage shelf 10, when a cleaning start command is issued via the control console HS, the purge controller H1 controls the operation of the mass flow controller 40 according to the cleaning pattern P2. In this, the target flow rate is set to a cleaning flow rate and the feed period will be set to a period for cleaning.

Further, upon completion of carry-in of the container 50 onto the carry in/out conveyer CV and receipt of this container 50 by the transfer device 25 of the stacker crane 20, the controller H issues a target flow rate for nozzle cleaning according to the nozzle purge pattern P1.

In the instant embodiment, the controller H is configured to determine the timing of the carry-in of the container 50 onto the carry in/out conveyer CV via communication thereto of a storage command from a carriage controller (not shown) for controlling the operation of the hoist type transport carriage D.

That is, when the transport carriage D has carried in a container 50 on the carry in/out conveyer CV, the carriage controller issues a storage command to the controller H.

Further, in response to detection of the container 50 by two load presence sensors 10z, the controller H issues a target flow rate (feed rate) for storage according to one pattern selected in advance via the control console HS from the four storage purge patterns P3-P6.

More particularly, the user will variably set, as pattern specifying parameters via the control console HS, the target flow rate and the feed period according to each of the four storage purge patterns P3-P6 for feeding inactive gas from the inactive gas feeding sections F to the containers 50 and will proceed to experimentally use each of the four storage purge patterns P3-P6, thus selecting one preferred pattern.

(Purge Patterns)

Next, the nozzle purge pattern P1, the cleaning pattern P2 and the four storage purge patterns P3-P6 respectively will be explained in greater details with reference to FIG. 7.

The nozzle purge pattern P1 is defined as a pattern for feeding nitrogen gas for a period t1 set as pre-storage period from the timing of the issuance of the above-described storage command at a target flow rate L1 set as the target flow rate for nozzle cleaning.

The feed period t1 is set to e.g. 5 seconds and the target flow rate L1 is set to e.g. 30 liters/min.

The cleaning pattern P2 is defined as a pattern for feeding nitrogen gas for a period t2 set as a setting initial feed period from issuance of the cleaning start command via the control console HS at a target flow rate L2 which is set as the target feed rate for cleaning.

The feed period t2 is set to e.g. 1800 seconds and the target flow rate L2 is set to e.g. 20 liters/min.

Regarding each one of the four storage purge patterns P3-P6, as the target flow rate for storage, there are set an initial target flow rate $L\alpha$ and a steady-state target flow rate $L\beta$ which is lower (smaller) than the initial target flow rate $L\alpha$.

The initial target flow rate $L\alpha$ is set to e.g. 50 liters/min. and the steady-state target flow rate $L\beta$ is set to e.g. 5 liters/min.

And, for each one of the four storage purge patterns P3-P6, in feeding nitrogen gas to the container 50, these patterns are common in that first the initial target flow rate $L\alpha$ is set as the target flow rate and then the steady-state target flow rate $L\beta$ is set as the target flow rate. Except this, these patterns are set as patterns different from each other.

Hereinafter, the four storage purge patterns P3-P6 will be referred to respectively as the first storage purge pattern P3, the second storage purge pattern P4, the third storage purge pattern P5, and the fourth storage purge pattern P6 and these respective patterns will be explained further.

The first storage purge pattern P3 is defined as a pattern as follows. According to this pattern, during a set feed period t3 from the completion of container storage, i.e. completion of storage of the container 50 at the storage section 10S, the nitrogen gas is fed at the feed rate L31 as the initial target flow rate Lα. Thereafter the nitrogen gas is fed at the feed rate L32 as the steady-state target flow rate Lβ, and this feeding is continued during continued detection of the presence of the container 50 by the pair of load presence sensors 10z.

The set feed period t3 is set to e.g. 5 minutes as the initial value and this set feed period t3 will be variably set by the user as described above.

The second storage purge pattern P4 is defined as a pattern as follows. Namely, during a set feed period t41 from the completion of container storage, the nitrogen gas is fed at the feed rate L41 as the initial target flow rate Lα and thereafter the nitrogen gas is fed intermittently at the feed rate L42 as the steady-state target flow rate Lβ, and this intermittent feeding is continued during continued detection of the presence of the container 50 by the pair of load presence sensors 10z.

That is, the second storage purge pattern P4 is set as a pattern according to which after change of the target flow rate from the feed rate L41 as the initial target flow rate Lα to the feed rate L42 as the steady-state target flow rate Lβ, feeding of nitrogen gas is continued for the set feed period t43 and then the feeding is paused for the set pause period and these feeding and pausing are repeated.

Namely, after the change of flow rate from the feed rate L41 as the initial target flow rate Lα to the feed rate L42 as the steady-state target flow rate Lβ, of a repetition cycle t42, during the set feed period t43, nitrogen gas is fed at the feed rate L42 and during the set pause period t42-t43, feeding of nitrogen gas is paused. These operations are effected in repetition during continued detection of the container 50 by the pair of load presence sensors 10z.

Incidentally, the set feed period t41 will be set to e.g. 5 minutes as the initial value and the repetition cycle t42 will be set to e.g. 10 minutes as the initial value. The set feed period t43 will be set to e.g. 5 minutes as the initial value. As described above, the set feed period t41, the repetition cycle t42 and the set feed period t43 will be variably set by the user.

The third storage purge pattern P5 is defined as a pattern as follows. Namely, during the set feed period t51 after completion of storage of container, nitrogen gas is fed at the feed rate L51 as the initial target flow rate Lα. Thereafter, during the set feed period t52, nitrogen gas is fed at the feed rate L52 as the steady-state target flow rate Lβ. This basic pattern is repeated during continued detection of the presence of container 50 by the pair of load presence sensors 10z.

Incidentally, the set feed period t51 will be set to e.g. 5 minutes as the initial value and the set feed period t52 will be set to e.g. 5 minutes as the initial value. As described above, the set feed period t51 and the set feed period t52 will be variably set by the user.

The fourth storage purge pattern P6 is defined as a pattern as follows. Namely, during the set feed period t61 after completion of storage of container, nitrogen gas is fed at the feed rate L61 as the initial target flow rate Lα. Thereafter, during the set feed period t64-t61, nitrogen gas is fed intermittently at the feed rate L62 as the steady-state target flow rate Lβ. This basic pattern is continued during continued detection of the presence of container 50 by the pair of load presence sensors 10z.

That is, in the fourth storage purge pattern P6, there are set a first repetition cycle t64 in which feeding of gas at the feed rate L61 as the initial target flow rate Lα is repeated and a second repetition cycle t62 in which intermittent feeding of nitrogen gas at the feed rate L62 as the steady-state target flow rate Lβ is repeated.

And, at the time of completion of container storage and at the time of start of the first repetition cycle t64, during the set feed period t61, nitrogen gas is fed at the feed rate L61 as the initial target flow rate Lα. And, upon completion of feeding of nitrogen gas at the feed rate L61 as the initial target flow rate Lα, during the set feed period t63, nitrogen gas is fed at the feed rate L62 as the steady-state target flow rate Lβ and feeding of nitrogen gas is paused during the set pause period t62-t63. These operations are repeated in alternation.

Incidentally, the set feed period t61 will be set to e.g. 5 minutes as the initial value and the first repetition cycle t64 will be set to e.g. 30 minutes as the initial value and the second repetition cycle t62 will be set to e.g. 5 minutes as the initial value.

In this fourth storage purge pattern P6, the first repetition cycle t64 and the second repetition cycle t62 too are variably set by the user.

In the instant embodiment, the first target flow rate LM1 corresponds to the initial target flow rate Lα and second target flow rate LM2 corresponds to the steady-state target flow rate Lβ. And, the target flow rate L1 corresponds to the pre-storage target flow rate LM0.

And, the controller H is configured to be capable of switching over the controlled state of each inactive gas feeding section F among a first feed state R1, a second feed state R2 and a pre-storage feed state Rn. Here, the first feed state R1 is a state in which the mass flow controller 40 is operated to feed the inactive gas at a first target flow rate LM1 to the transport container 50 stored in the storage section 10S. The second feed state R2 is a state in which the mass flow controller 40 is operated to feed the inactive gas at a second target flow rate LM2 to the transport container 50 stored in the storage section 10S, the second target flow rate LM2 being smaller than the first target flow rate LM1. The pre-storage feed state Rn is a state in which the mass flow controller 40 is operated to feed the inactive gas to the discharge opening 10i at a target flow rate L1 smaller than the first target flow rate LM1 only for duration of a feed period t1 prior to storage of the transport container 50 in the storage section 10S after the issuance of the storage command for storing the container 50 in the storage section 10S.

Further, the purge controller H1 memorizes a maximum allowable flow rate that can be fed from the first branch feed pipe Lb1 to the first channel CH1 and a maximum allowable flow rate that can be fed from the second branch feed pipe Lb2 to the second channel CH2. And, a simultaneous feeding calculating section H11 as a program module provided in the purge controller H1 calculates a maximum simultaneous feed number N which is the maximum number of inactive gas feeding sections F that can be controlled to the first feed state R1 at one time, based on the maximum allowable flow rate Lmax, the first target flow rate LM1, the second target flow rate LM2 and the target flow rate L1

The simultaneous feeding calculating section H11 calculates the maximum simultaneous feed number N according to the following formula (1).

$$L\mathrm{max} = (N \times LM1) + \{(B-N) \times LM2\} + LM0 \qquad (1)$$

where, Lmax is the maximum allowable flow rate, B is the total number of the group of storage sections 10s corresponding to the group of inactive gas feeding sections F, LM1 is the first target flow rate, LM2 is the second target flow rate, LM0 is the pre-storage target flow rate, respectively. Solving the above formula for N, then, the following formula (2) is obtained.

$$N = (L\mathrm{max} - B - LM2 - LM0)/(LM1 - LM2) \qquad (2)$$

Namely, the simultaneous feeding calculating section H11 is configured to calculate the maximum simultaneous feed number N such that the total of the target flow rates for all of the group of inactive gas feeding sections F corresponding to the group of storage sections 10S may be less than or equal to the maximum allowable flow rate Lmax.

(Purge Pattern Selection by Controller H)

In the instant embodiment, the purge controller H1 as the controller H is configured to be capable of memorizing the plurality of purge patterns (P1-P6) including the storage purge patterns P3-P6 as the saving feed patterns.

The control console HS is configured to display information relating to the storage purge patterns P3-P6 under the storage condition of the container 50 being stored in the storage section 10S and to allow manual selection of which storage purge pattern is to be used via an unillustrated input device (a mouse, a keyboard, etc.). That is, the control console HS is provided as a pattern selecting section for the manual selection of which of the storage purge patterns P3-P6 is to be used; and the purge controller H1 is configured to control the operation of the mass flow controller 40 according to a saving feed pattern selected in advance via the control console HS from the plurality of storage purge patterns P3-P6, thus feeding inactive gas into the container 50.

(Execution of Simultaneous Start Coping Process)

Next, execution of a simultaneous start coping process by the controller H will be explained with reference to the flowcharts of FIG. 8 and FIG. 9.

Figure 8:
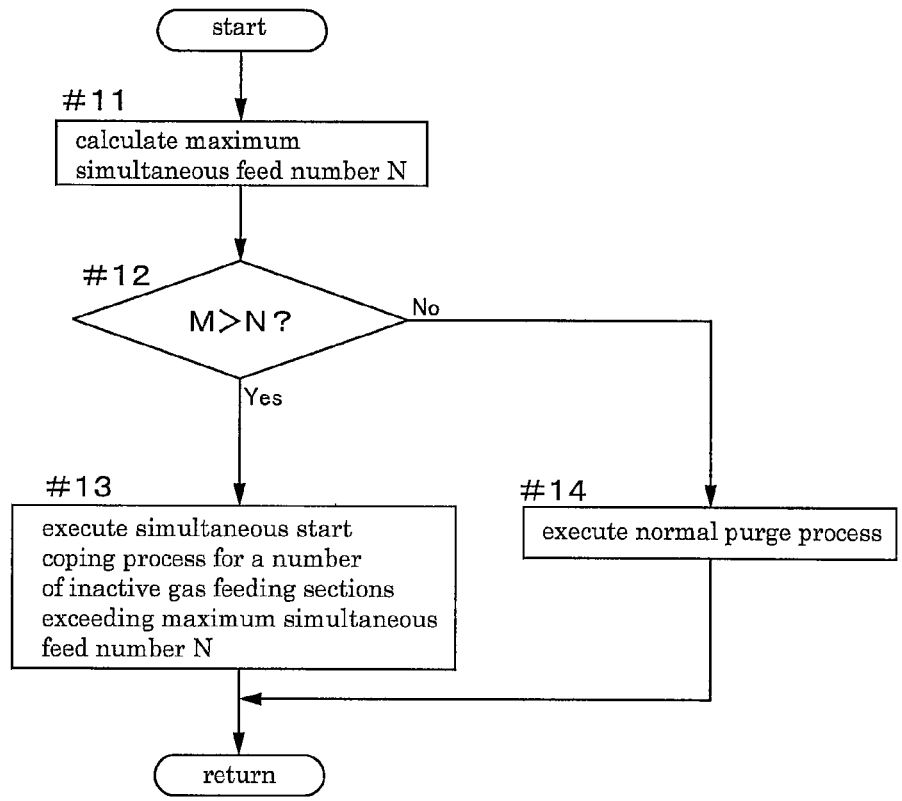
FIG. 8 is a flowchart relating to a process for determining execution of a simultaneous start coping process.
Figure 9:
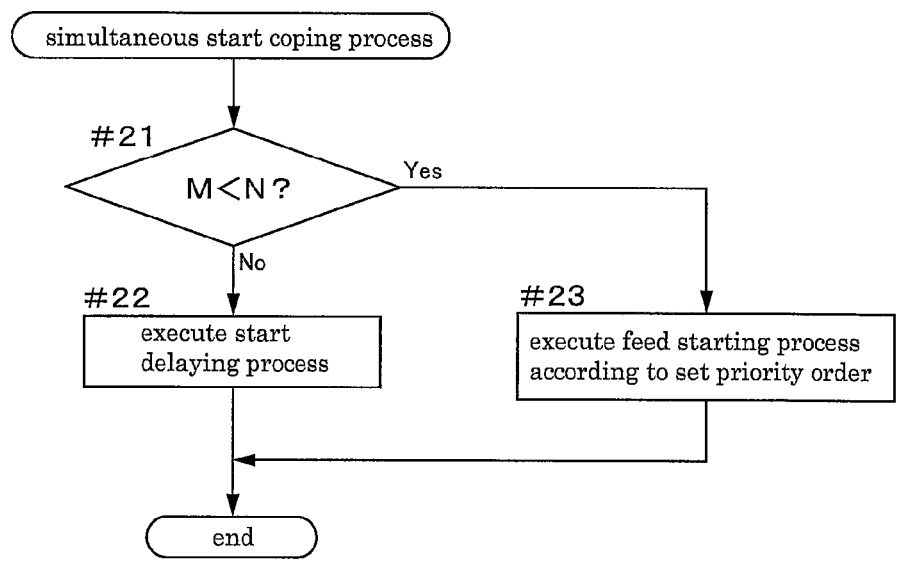
FIG. 9 is a flowchart illustrating the simultaneous start coping process.

As shown in FIG. 8, the simultaneous feeding calculating section H11 calculates the maximum simultaneous feed number N according to the formula (2) above (step #11).

Then, determination is made whether the total target number M which is the total number of inactive gas feeding sections F determined to be controlled to the first feed state R1 at one time is greater than the maximum simultaneous feed number N or not (step #12). Here, in the instant embodiment, the total target number M is the sum of: the number of inactive gas feeding sections F that were controlled already to the first feed state R1 at the time of the execution of this determination, but for which a set feed period from the start of the first feed state R1 has not yet lapsed; the number of inactive gas feeding sections F for which the start delaying process is being executed between the previous determination and the current determination; and the number of inactive gas feeding sections F that were determined to be controlled to the first feed state R1 at a timing between the previous determination and the current determination. In the above, the third number above includes the number of inactive gas feeding sections F corresponding to those storage sections 10S into which the containers 50 were stored between the execution of the previous determination and the execution of the current determination and the number of inactive gas feeding sections F for which the timing of starting the first feed state R1 regulated by the purge pattern arrived between the execution of the previous determination and the execution of the current determination. If it is determined that the total target number M is greater than the maximum simultaneous feed number N (YES at step #12), the purge controller H1 executes the simultaneous start coping process for a number of inactive gas feeding sections F exceeding the maximum simultaneous feed number N (step #13). The details of this simultaneous start coping process will be given later herein. On the other hand, if it is determined that the total target number M is smaller than the maximum simultaneous feed number N (NO at step #12), the purge controller H1 executes the normal purge process for all of the inactive gas feeding sections F (step #14). In the above, the "normal purge process" means a process in which the inactive gas is fed to the inside of the container 50 without changing the target flow rate and the discharge period set according to a purge pattern selected from the saving storage urge patterns P3-P6. The controller H is configured to execute the simultaneous start coping process of step #13 in repetition for each event of the lapse of a set delay period TD while the result of the determination at step #12 remains YES. That is, the start delaying process is executed for each unit of the set delay period TD and upon lapse of this set delay period TD, determination is made whether to execute another start delaying process or not.

Next, with reference to FIG. 9, the simultaneous start coping process will be explained.

First, the purge controller H1 determines whether the total target number M is smaller than the maximum simultaneous feed number N or not (step #21). Here, if it is determined that the total target number M is greater than the maximum simultaneous feed number N (NO at step #21), since controlling to the first feed state R1 is not possible for the number of inactive gas feeding sections F exceeding the maximum simultaneous feed number N, the start delaying process is executed therefor which is a process of delaying starting of the first feed state R1 for the set delay period TD (step #22). Conversely, if it is determined that the total target number M is smaller than the maximum simultaneous feed number N (YES at step #21), since controlling to the first feed state R1 is possible for delaying process target feeding sections, a feed starting process (feed process) for controlling to the first feed state R1 is executed. In this, e.g. according to the priority order set based on the identification information managed by the stocker controller H2, that is, according to the order of the serial ID numbers as the identification information, the inactive gas feeding sections F subjected to the execution of feed starting process will be selected and the feed starting process will be executed for the selected inactive gas feeding sections F one after another (step #23). Upon completion of the execution of step #22 or step #23, the purge controller H1 ends the simultaneous start coping process.

Namely, the purge controller H1 executes the simultaneous start coping process (step #13) if it is determined that a number of inactive gas feeding sections F exceeding the maximum simultaneous feed number N has been determined to be controlled at one time to the first feed state R1 (YES at step #12). More particularly, of those inactive gas feeding sections F determined to be controlled at one time to the first feed state R1, the same number of inactive gas feeding sections N as the maximum simultaneous feed number N will be controlled to the first feed state R1, and for the other inactive gas feeding sections F, the start delaying process will be executed (step #22), so that the starting of the first feed state R1 therefor may be delayed by the set delay period TD.

Incidentally, the set delay period TD is calculated according to the following formula (3).

set delay period $TD$=period of duration of first feed state $R1/(N+1)$ (3)

In the instant embodiment, the purge controller H1 is control a delaying process target feeding section as the inactive gas feeding section F subjected to the start delaying process to the second feed state R2 during duration of delaying of start of the first feed state R1 by the start delaying process.

Further, the purge controller H1 is configured to execute the following process as the simultaneous start coping process. Namely, after execution of the start delaying process, if it is determined that the total target number M falls short of the maximum simultaneous feed number N (YES at step #21), of those delaying process target feeding sections which are the inactive gas feeding sections F currently subjected to execution of the start delaying process, for a certain number of them which number will prevent the maximum simultaneous feed number N from being exceeded (by the total) even if the start delaying process is executed therefor (that is, the "certain number" corresponds to a number not exceeding the difference between the total target number M and the maximum simultaneous feed number N), the feed start process as the process for controlling to the first feed state R1 will be executed (step #23). Incidentally, in case the determination of step #21 is executed when a delay process target feeding section exists, unlike the case of the determination at step #12, the total target number M will exclude the number of inactive gas feeding sections F for which the start delaying process has been executed during the period between the timing of the execution of the previous determination and the timing of the execution of the current determination and the number of inactive gas feeding sections F determined to be controlled to the first feed state R1 during the period between the timing of the execution of the previous determination and the timing of the execution of the current determination. That is, the total target number M in this case is equal to the number of inactive gas feeding sections F controlled already to the first feed state R1 at the time of execution of the current determination, but for which the set feed period from the start of the first feed state R1 has not yet lapsed.

And, the stocker controller H2 manages the plurality of storage sections 10S based on the identification information; and the purge controller H1 selects the delaying process target feeding sections subjected to execution of the feed starting process according to the priority order set based on the identification information. In the instant embodiment, the identification information comprises serial ID numbers and the purge controller H1 executes the feed process starting from the delaying process target feeding sections having smaller serial ID numbers or having greater serial ID numbers.

(Result of Execution of Simultaneous Start Coping Process)

Next, the result of execution of the simultaneous start coping process will be explained with reference to the timing chart shown in FIG. 10.

FIG. 10 is a timing chart showing the ID numbers as the identification information provided to the storage sections 10S along the vertical axis and elapsed periods along the horizontal axis. In the example shown in FIG. 10, the initial state is set as a state when no container 50 is stored in any one of the plurality of storage sections 10S; and in response to issuance of storing commands for storing the containers 50, the containers 50 will be stored into the storage sections 10S from the storage section 10S having the ID number "1" to the storage section 10S having the ID number "12", starting from the storage sections having smaller ID number, i.e. starting from the storage section 10S having the ID number "1". Incidentally, in the instant embodiment, there is provided only one stacker crane 20. Therefore, it is not possible to store the containers 50 into the storage sections 10S altogether at one time. Namely, the timing of storing into the storage section 10S differs for each container 50.

The table shown under the horizontal axis in FIG. 10 shows the numbers of inactive gas feeding sections F controlled to the first feed state R1, the second feed state R2 and the pre-storage feed state Rn at one time when the elapsed period is divided in the unit period of the set delay period TD. For the first feed state R1, the upper stage shows the numbers of the inactive gas feeding sections F controlled to the first feed state R1, prior to execution of the start delaying process (that is, the case of no start delaying process being executed). This number is equal to the total target number M and in case there exists a delaying process target feeding section, the number is equal to the sum of the maximum simultaneous feed number N and the number of the delaying process target feeding sections. Further, for the first feed state R1, the lower stage in the figure shows the numbers of the inactive gas feeding sections F controlled to the first feed state R1 after the execution of the start delaying process (that is, the case of the start delaying process being executed). Incidentally, FIG. 10 shows the case of applying the third storage purge pattern P5.

In the formula (2) above, provided the total number of storage sections B=12, the maximum allowable flow rate: Lmax=315 (liters/minute); the first target flow rate: LM1=50 (liters/minute), the second target flow rate: LM2=5 (liters/minute), the pre-storage target flow rate: LM0=30 (liters/minute), the maximum simultaneous feed number N will be calculated as: N=5. Further, if the set delay period TD is calculated according to the formula (3), there is obtained: 5 (minutes)/(5+1)=50 (seconds).

Therefore, in case the number of the inactive gas feeding sections F determined to be controlled to the first feed state R1 becomes greater than "5", the number of inactive gas feeding sections F in the excess of "5" will be set as the delaying process target feeding sections and the start of the first feed state R1 will be delayed therefor for 50 seconds, which is the set delay period TD.

Incidentally, the respective numeric values above only show one respective examples of such numeric values that can be set in the present invention or numeric values calculated based on them, and the scope of application of the present invention is not limited to these particular numeric values.

Referring to the timing chart in FIG. 10, for the 19th unit period on the horizontal axis, six inactive gas feeding sections F will be determined to be controlled to the first feed state R1. Since the maximum simultaneous feed number N is "5" in the present embodiment as described hereinbefore, for any one of the inactive gas feeding sections F, the start delaying process for delaying the timing of starting the first feed state R1 will be executed. In this case, the start delaying process will be executed for the inactive gas feeding section F corresponding to the storage section 10S having the serial ID number of "4" which is scheduled to be controlled next to the first feed state R1.

For the next 20th unit period, six inactive gas feeding sections F will be determined to be controlled to the first feed state R1. In this, in the 20th unit period, the number of the inactive gas feeding sections F which were controlled already to the first feed state R1 and for which the set feed period from the timing of the start of the first feed state R1 has not yet lapsed, is "3" which is smaller than the maximum simultaneous feed number N. Therefore, for the inactive gas feeding section F currently engaged in execution of the start delaying process (in this example the inactive gas feeding section F corresponding to the storage section 10S having the serial ID number "4"), the feed starting process will be executed, so that this inactive gas feeding section F will be controlled to the first feed state R1. Further, the start delaying process will be executed for the inactive gas feeding section F corresponding to the storage section 10S having the serial ID number of "5" which is scheduled to be controlled next to the first feed state R1.

For the next $21^{st}$ unit period, seven inactive gas feeding sections F will be determined to be controlled to the first feed state R1. Here, for the $21^{st}$ unit period, the number of the inactive gas feeding sections F that were controlled already to the first feed state R1 and for which the set feed period from the timing of the start of the first feed state R1 has not yet elapsed is "5" which is equal to the maximum simultaneous feed number N. Therefore, the start delaying process will be executed respectively for the inactive gas feeding section F corresponding to the storage section 10S having the serial ID number "5" and the inactive gas feeding section F corresponding to the storage section 10S having the serial ID number "6" that are scheduled to be next controlled to the first feed state R1.

As described above, in the instant embodiment, with the simple configuration of determining whether a start delaying process is needed or not for each lapse of the unit period, it has been made possible to provide an article storage facility that can restrict occurrence of a greater number of inactive gas feeding sections F than the maximum simultaneous feed number N being controlled at one time to the first feed state R1 and that also can solve early the condition of delaying the start of the first feed state R1.

Incidentally, in FIG. 10, the mark Re denotes the unit period representing the condition of the start delaying process being executed.

[Other Embodiments]

(1) In the foregoing embodiment, there was disclosed an exemplary arrangement wherein the transport container 50 is a FOUP and the substrate to be accommodated is a semiconductor wafer W and the nitrogen gas is fed as the inactive gas into the transport container. However, the embodiment of the present invention is not limited to such arrangement. For instance, the substrate to be accommodated can be a reticle and the transport container 50 can be a reticle container. Further, as the inactive gas to be fed to the transport container, in addition to nitrogen gas, various kinds of gas having low reactivity relative to the accommodated substrate, such as argon gas, can be employed also.

(2) In the foregoing embodiment, there was illustrated the exemplary arrangement that the flow rate detecting device is incorporated in the mass flow controller 40. However, the embodiment of the present invention is not limited to such arrangement. For instance, the flow rate detecting device can be incorporated in the feed pipe Li.

(3) In the foregoing embodiment, there was described the arrangement in which the mass flow controller 40 is controlled to provide the target flow rate in the two stages, i.e. the first target flow rate LM1 and the second target flow rate LM2 when the container 50 is stored. However, the invention is not limited to such arrangement. Instead, the mass flow controller 40 may be configured to switch over the target flow rate in three stages or more, for example.

(4) In the foregoing embodiment, there was shown the exemplary arrangement in which in the second feed state R2 realized between the first feed state R1 and the next first feed state R1, the flow rate adjusting device is operated to feed the inactive gas at the second target flow rate LM2 smaller than the first target flow rate LM1, either continuously or intermittently. In place of such arrangement, in the second feed state R2 realized between the first feed state R1 and the next first feed state R1, the second target flow rate LM2 may be set continuously to 0 liter/min.

(5) In the foregoing embodiment, the simultaneous feeding calculating section H11 for calculating the maximum simultaneous feed number N as the maximum number of inactive gas feeding sections F that can be controlled at one time to the first feed state R1 is incorporated in the purge controller H1. Instead, this simultaneous feeding calculating section H11 may be incorporated in a controller other than the purge controller H1 or in an independent computer (including a micro controller). Further alternatively, the simultaneous feeding calculating section H11 may be omitted at all, and the maximum allowable flow rate Lmax, the first target flow rate LM1, the second target flow rate LM2, the pre-storage target flow rate LM0 and the maximum simultaneous feed number N may be set as respective fixed values.

(6) In the foregoing embodiment, as the start delaying process, the start of the first feed state R1 is delayed by the set delay period TD and thereafter, determination of whether to execute another start delaying process or not is made upon lapse of each set delay period TD and if it is determined that the number of the inactive gas feeding sections F controlled to the first feed state R1 has become smaller than the maximum simultaneous feed number N, the feed starting process is executed for the delaying process target feeding section starting from the timing of the lapse of the set delay period TD. Instead of this arrangement, a further arrangement as follows is also possible. Namely, when it is determined that the number of the inactive gas feeding sections F controlled to the first feed state R1 has become smaller than the maximum simultaneous feed number N (e.g. when the load detection sensor 10z detects that a container 50 to which the inactive gas was fed under the first feed state R1 has now been taken out of the storage section 10S), even if the set delay period TD has not yet elapsed, the feeding start process may be executed for the delaying process target feeding section. With this alternative arrangement, when the number of the inactive gas feeding sections F controlled to the first feed state R1 has become smaller than the maximum simultaneous feed number N, the feeding start process can be executed for the delaying process target feeding section early, without waiting for the lapse of the next set delay period TD.

Further, in the foregoing embodiment, there was shown the arrangement in which as the start delaying process, starting of the first feed state R1 is delayed for the set delay period TD and then upon lapse of each set delay period TD, determination is made whether the number of the inactive gas feeding sections F controlled to the first feed state R1 has become smaller than the maximum simultaneous feed number N or not (that is, whether execution of the feeding start process is possible or not). Instead of such arrangement, the following alternative arrangement is possible. Namely, the set delay period is set as a period from the timing of the start of the start delay process to the timing when starting of the first feed state R1 for this delaying process target feeding section becomes possible as the number of the inactive gas feeding sections F controlled to the first feed state R1 has become smaller than the maximum simultaneous feed number N. In this case, the set delay period will vary, depending on the carry in/out situation.

(7) In the foregoing embodiment, there was shown the arrangement in which while starting of the first feed state R1 is being delayed by the start delaying process, the purge controller H1 controls the operation of the mass flow controller 40 so as to feed the inactive gas under the second feed state R2 to this inactive gas feeding section F. Instead of such arrangement, an alternative arrangement as follows is also possible. Namely, when start of the first feed state R1 is being delayed, the operation of the mass flow controller 40 is controlled so as to feed the inactive gas at a flow rate other than the second target flow rate. The flow rate in this case should preferably be smaller than the second target flow rate, but may be greater than the second flow rate as long as such flow rate will not affect the maximum simultaneous feed number N. Further alternatively, the feed rate of the inactive gas may be variable while starting of the first feed state is being delayed, such that an excess flow rate of inactive gas that can be fed may be fed for each occasion.

(8) In the foregoing embodiment, the controlled state of the inactive gas feeding section F can be switched to the pre-storage feed state Rn. However, embodiment of the present invention is not limited to such arrangement. Instead, the switchable states may omit the pre-storage feed state Rn.

(9) In the foregoing embodiment, there was shown the exemplary arrangement in which the identification information managed by the stocker controller H1 comprise serial ID numbers unique to the respective storage sections 10S. Instead of this, the identification information can be storage section IDs in the form of character strings, and the priority order can be defined for these storage IDs. Incidentally, for the priority order in this case, the storage sections 10S near the entrance may be provided with higher priority and the storage sections 10s far from the entrance may be provided with lower priority. Or, conversely, the storage sections 10S near the entrance may be provided with lower priority and the storage sections 10s far from the entrance may be provided with higher priority. Or, the storage sections 10S used less frequently may be provided with higher priority and the storage sections 10S used more frequently may be provided with lower priority. In this case, it becomes also possible to achieve uniformity in the use frequency of the storage sections 10S.

(10) In the foregoing embodiment, it was arranged such that the feeding start process is executed according to the priority order set based on the identification information of the storage sections 10S managed by the stocker controller H2. Instead of such arrangement, a standby period determining section for determining a standby period which is a period measured from the start of the start delaying process for each of the delaying process target feeding sections may be incorporated in the purge controller H1, so that the purge controller H1 may execute the feeding start process starting from the delaying process target feeding section having the longer standby period from the start of the start delaying process. With this arrangement, for a container 50 having a long standby period from the start of the start delaying process, further extended execution of the start delaying process can be restricted, thus preventing contamination of the semiconductor wafer W inside the container 50.

(11) In the foregoing embodiment, as storage sections for storing containers 50, the storage sections 10S of the storage shelves 10 are disclosed as the example thereof. However, the storage sections may be storage sections provided on a lateral side of the guide rail G of the hoist type transport carriage D.

(12) In the foregoing embodiment, the controller H is configured to issue a cleaning target flow rate command according to the nozzle purge pattern P1 upon completion of carry-in of the container 50 onto the carry in/out conveyer CV and subsequent receipt of this container 50 by the transfer device 25 of the stacker crane 20. However, embodiment of the present invention is not limited to such arrangement. Instead, for instance, the target flow rate for nozzle cleaning according to the nozzle purge pattern P1 may be issued at the timing of start of the operation of the stacker crane 20 for receiving the container 50 or the timing of arrival of the stacker crane 20 at a predetermined traveling position on the traveling path for receiving the container 50.

(13) In the arrangement shown in the foregoing embodiment, in case a number of inactive gas feeding sections F exceeding the maximum simultaneous feed number N calculated by the maximum simultaneous feeding calculating section H11 have been determined to be controlled at one time to the first feed state R1, of these inactive gas feeding sections F determined to the controlled at one time to the first feed state R1, the same number of inactive gas feeding sections F as the maximum simultaneous feed number N are controlled to the first feed state R1, whereas the start delaying process is executed for the other inactive gas feeding sections F. However, embodiment of the present invention is not limited to such arrangement. Instead, of the inactive gas feeding sections F determined to the controlled at one time to the first feed state R1, a number of inactive gas feeding sections F fewer than the maximum simultaneous feed number N may be controlled to the first feed state R1, and for the remaining inactive gas feeding sections F, the start delaying process may be executed for delaying starting of the first feed state R1 by the set delay period TD.

That is, in case feeding is to be resumed after temporarily pausing feeding of inactive gas for all the inactive gas feeding sections F or in the case of e.g. switchover from a manual operation to an automatic operation, where the inactive gas feeding sections corresponding to all of the storage sections 10S storing the transport containers 50 therein are determined to be controlled to the first feed state R1 at one time, for realizing speedy replacement of the gas present inside the transport containers 50 by new inactive gas, it may be desired that all the inactive gas feeding sections F corresponding to the storage sections 10S storing the transport containers 50 should be controlled to the first feed state R1 at a same (one) timing. In such case, in order to avoid occurrence of an inconvenient phenomenon that sudden increase in the flow rate of the inactive gas fed from the inactive gas feeding sections F causes a shock to the mass flow controllers 40 of the inactive gas feeding sections F and/or to the pipes extending thereto, rather than increasing the number of inactive gas feeding sections F to be controlled to the first feed state R1 all at once to the maximum simultaneous feed number N, but firstly, a certain set number (starting number) of inactive gas feeding sections F fewer than the maximum simultaneous feed number N may be controlled to the first feed state R1 and then after a certain minimum delay period (e.g. from 1 second to a few seconds), one or set additional number of inactive gas feeding sections F may be controlled to the first feed state R1, so that the same number of inactive gas feeding sections F as the maximum simultaneous feed number N may be controlled eventually to the first feed state R1. The above-descried starting number can be set to a number which is ½ or less, or ⅔ or less, of the maximum simultaneous feed number N. And, this starting number may be calculated in advance together with the calculation of the maximum simultaneous feed number N or fixedly set in advance. Incidentally, the method of calculating the starting number is not limited to those described above.

The invention claimed is:

1. An article storage facility comprising:
   a plurality of storage sections each storing a transport container accommodating a substrate therein;
   a transport device for transporting the transport containers to the plurality of storage sections;
   an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;
   a controller configured to control operations of the transport device and the flow rate adjusting device;
   a feed source for feeding the inactive gas to a group of the inactive gas feeding sections corresponding to a group of storage sections of the plurality of storage sections;

wherein the feed source is configured with a maximum allowable flow rate that can be fed from the feed source to the group of inactive gas feeding sections;

the controller is capable of switching over a controlled state of each inactive gas feeding section of the group of inactive gas feeding sections between a first feed state in which the flow rate adjusting device is operated to feed the inactive gas at a first target flow rate to the transport container stored in the storage section and a second feed state in which the flow rate adjusting device is operated to feed the inactive gas at a second target flow rate to the transport container stored in the storage section, the second target flow rate being smaller than the first target flow rate;

with a maximum number of the inactive gas feeding sections that can be controlled to the first feed state at one time being defined as a maximum simultaneous feed number, the controller determines the maximum simultaneous feed number based on the maximum allowable flow rate, a total number of storage sections in the group of storage sections, the first target flow rate, and the second target flow rate; or the maximum simultaneous feed number, which is determined based on the maximum allowable flow rate, a total number of storage sections in the group of storage sections, the first target flow rate, and the second target flow rate, is inputted to the controller; and when the controller determines that the maximum simultaneous feed number is exceeded by a first total target number which is a total number of inactive gas feeding sections determined to be controlled to the first feed state at one time, the controller controls some of the inactive gas feeding sections determined to be controlled to the first feed state at one time, which are not more than the maximum simultaneous feed number, to the first feed state and executes a start delaying process for the others in which process starting of the first feed state is delayed by a set delay period;

the controller is configured to complete the process of controlling the inactive gas feeding section to the first feed state when a predetermined condition for completion is satisfied;

the control is further configured to repeatedly determine, after execution of the start delaying process, whether a second total target number which is a total number of the inactive gas feeding sections that have been controlled to the first feed state falls short of the maximum simultaneous feed number, and if the second total target number falls short of the maximum simultaneous feed number, execute a feed process in which, of the inactive gas feeding sections subjected to the execution of the start delaying process, a number of these inactive gas feeding sections not exceeding a difference between the second total target number and the maximum simultaneous feed number are controlled to the first feed state.

2. The article storage facility according to claim 1, wherein the controller is configured to control the inactive gas feeding section subjected to the start delaying process to the second feed state.

3. The article storage facility according to claim 1, wherein when the controller determines that the maximum simultaneous feed number is exceeded by the first total target number, of the inactive gas feeding sections determined to be controlled to the first feed state at one time, the controller controls the same number of the inactive gas feeding sections as the maximum simultaneous feed number to the first feed state and executes the start delaying process for the others.

4. The article storage facility according to claim 1, wherein:
there is provided a simultaneous feed calculating section for calculating the maximum simultaneous feed number;
the controller is configured to be capable of switching over the controlled state of each of the group of inactive gas feeding sections not only between the first feed state and the second feed state, but also to a pre-storage feed state in which the flow rate adjusting device is operated to feed the inactive gas to the discharge opening of the storage section at a pre-storage target flow rate smaller than the first target flow rate only for duration of a set period prior to storage of the transport container in the storage section; and
the simultaneous feed calculating section calculates the maximum simultaneous feed number, based on the maximum allowable flow rate, a total number of storage sections in the group of storage sections, the first target flow rate, the second target flow rate; and the pre-storage target flow rate.

5. The article storage facility according to claim 1, wherein:
there is provided a simultaneous feed calculating section for calculating the maximum simultaneous feed number; and
the simultaneous feed calculating section is configured to calculate the maximum simultaneous feed number such that the total of the target flow rates of the inactive gas for all of the group of inactive gas feeding sections is smaller than or equal to the maximum allowable flow rate.

6. The article storage facility according to claim 1, wherein the controller is configured to effect management based on identification information of the plurality of storage sections, in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and
the controller selects the inactive gas feeding sections to be subjected to the execution of the feed process according to the priority order of the storage sections.

7. The article storage facility according to claim 1, wherein:
there is provided a standby period determining section for determining a standby period which is a period measured from the start of the start delaying process for each of the inactive gas feeding sections subjected to the execution of the start delaying process;
the controller is configured to effect management based on the identification information of the plurality of storage sections;
in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and
the controller executes the feed process for the inactive gas feeding sections in the order starting from ones having longer standby periods determined by the standby period determining section.

8. An article storage method utilizing an article storage facility having:
- a plurality of storage sections each storing a transport container accommodating a substrate therein;
- a transport device for transporting the transport containers to the plurality of storage sections;
- an inactive gas feeding section provided for each of the plurality of storage sections for feeding inactive gas to the inside of the transport container stored in the storage section, the inactive gas feeding section including a discharge opening for discharging the inactive gas and a flow rate adjusting device capable of adjusting the flow rate of the inactive gas to be discharged via the discharge opening;
- a controller configured to control operations of the transport device and the flow rate adjusting device;
- a feed source for feeding the inactive gas to a group of the inactive gas feeding sections corresponding to a group of storage sections of the plurality of storage sections;
- wherein the feed source is configured with a maximum allowable flow rate that can be fed from the feed source to the group of inactive gas feeding sections;
- the controller is capable of switching over a controlled state of each inactive gas feeding section of the group of inactive gas feeding sections between a first feed state in which the flow rate adjusting device is operated to feed the inactive gas at a first target flow rate to the transport container stored in the storage section and a second feed state in which the flow rate adjusting device is operated to feed the inactive gas at a second target flow rate to the transport container stored in the storage section, the second target flow rate being smaller than the first target flow rate;
- with a maximum number of the inactive gas feeding sections that can be controlled to the first feed state at one time being defined as a maximum simultaneous feed number, the controller determines the maximum simultaneous feed number based on the maximum allowable flow rate, a total number of storage sections in the group of storage sections, the first target flow rate, and the second target flow rate; or the maximum simultaneous feed number which is determined based on the maximum allowable flow rate, a total number of storage sections in the group of storage sections, the first target flow rate, and the second target flow rate, is inputted to the controller; and
- wherein the article storage method comprises execution of the following step by the controller:
- a feed state controlling step at which when it is determined that the maximum simultaneous feed number is exceeded by a first total target number which is a total number of inactive gas feeding sections determined to be controlled to the first feed state at one time, the controller controls some of the inactive gas feeding sections determined to be controlled to the first feed state at one time, which are not more than the maximum simultaneous feed number, to the first feed state and a start delaying process is executed for the others in which process starting of the first control state is delayed by a set delay period;
- further comprising, at the feed state controlling step, completing the process of controlling the inactive gas feeding section to the first feed state when a predetermined condition for completion is satisfied; and
- repeatedly determining, after execution of the start delaying process, whether a second total target number which is a total number of the inactive gas feeding sections that have been controlled to the first feed state falls short of the maximum simultaneous feed number, and if determining that the second total target number falls short of the maximum simultaneous feed number, executing a feed process in which, of the inactive gas feeding sections subjected to the execution of the start delaying process, a number of these inactive gas feeding sections not exceeding a difference between the second total target number and the maximum simultaneous feed number are controlled to the first feed state.

9. The article storage method according to claim 8, wherein at the feed state controlling step, the inactive gas feeding section subjected to the start delaying process is controlled to the second feed state.

10. The article storage method according to claim 8, wherein at the feed state controlling step, when it is determined that the maximum simultaneous feed number is exceeded by the first total target number, of the inactive gas feeding sections determined to be controlled to the first feed state at one time, the same number of the inactive gas feeding sections as the maximum simultaneous feed number are controlled to the first feed state and the start delaying process is executed for the others.

11. The article storage method according to claim 8, wherein the controller is configured to be capable of switching over the controlled state of each of the group of inactive gas feeding sections not only between the first feed state and the second feed state, but also to a pre-storage feed state in which the flow rate adjusting device is operated to feed the inactive gas to the discharge opening of the storage section at a pre-storage target flow rate smaller than the first target flow rate only for duration of a set period prior to storage of the transport container in the storage section;
- as a further step executed by the controller, there is provided a simultaneous feed number calculating step for calculating the maximum simultaneous feed number; and
- at the simultaneous feed number calculating step, the maximum simultaneous feed number is calculated, based on the maximum allowable flow rate, a total number of storage sections in the group of storage sections, the first target flow rate, the second target flow rate, and the pre-storage target flow rate.

12. The article storage method according to claim 8, wherein:
- as a further step executed by the controller, there is provided a simultaneous feed number calculating step for calculating the maximum simultaneous feed number; and
- at the simultaneous feed number calculating step, the maximum simultaneous feed number is calculated such that the total of the target flow rates of the inactive gas for all of the group of inactive gas feeding sections is smaller than or equal to the maximum allowable flow rate.

13. The article storage method according to claim 8, wherein the controller is configured to effect management based on identification information of the plurality of storage sections, in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and at the feed state controlling step, the inactive gas feeding sections to be subjected to the execution of the feed process are selected according to the priority order of the storage sections.

14. The article storage method according to claim 8, wherein:
the article storage facility includes a standby period determining section for determining a standby period which is a period measured from the start of the start delaying process for each of the inactive gas feeding sections subjected to the execution of the start of the delaying process;
the controller is configured to effect management based on the identification information of the plurality of storage sections;
in response to issuance of a storage command for storing the transport container in the storage section, the controller selects, from the plurality of storage sections, an empty storage section for storing the transport container in accordance with a priority order set based on the identification information and then controls the operation of the transport device for storing the transport container to the selected empty storage section; and
at the feed state controlling step, the feed process is executed for the inactive gas feeding sections in the order starting from ones having longer standby periods determined by the standby period determining section.

* * * * *